(12) United States Patent
Kamakura

(10) Patent No.: US 11,454,818 B2
(45) Date of Patent: Sep. 27, 2022

(54) WEARABLE DISPLAY DEVICE

(71) Applicant: SEIKO EPSON CORPORATION, Tokyo (JP)

(72) Inventor: Kazuya Kamakura, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 283 days.

(21) Appl. No.: 16/828,372

(22) Filed: Mar. 24, 2020

(65) Prior Publication Data

US 2020/0310140 A1    Oct. 1, 2020

(30) Foreign Application Priority Data

Mar. 25, 2019  (JP) .............................. JP2019-056099

(51) Int. Cl.
| | |
|---|---|
| *G02B 27/01* | (2006.01) |
| *H05K 5/00* | (2006.01) |
| *H05K 5/04* | (2006.01) |
| *F21V 8/00* | (2006.01) |
| *H05K 7/20* | (2006.01) |
| *G06F 1/16* | (2006.01) |

(52) U.S. Cl.
CPC ....... *G02B 27/0176* (2013.01); *G02B 6/0085* (2013.01); *G02B 6/0091* (2013.01); *G02B 27/0172* (2013.01); *G06F 1/163* (2013.01); *H05K 5/0017* (2013.01); *H05K 5/0026* (2013.01); *H05K 5/04* (2013.01); *H05K 7/20963* (2013.01); *G02B 2027/0112* (2013.01); *G02B 2027/0178* (2013.01)

(58) Field of Classification Search
CPC .. G02B 27/01; G02B 27/017; G02B 27/0172; G02B 27/0176; G02B 2027/014; H05K 1/0203; H05K 7/2039; H05K 7/205
See application file for complete search history.

(56) References Cited

U.S. PATENT DOCUMENTS

| | | | | |
|---|---|---|---|---|
| 10,823,969 | B1* | 11/2020 | Hoover | H01M 10/615 |
| 2015/0378160 | A1* | 12/2015 | Lee | G06V 20/20 |
| | | | | 345/8 |
| 2017/0235147 | A1* | 8/2017 | Kamakura | G02C 5/126 |
| | | | | 359/630 |
| 2019/0377189 | A1* | 12/2019 | Toleno | B29C 70/081 |
| 2020/0252602 | A1* | 8/2020 | Oonishi | G02B 27/0179 |
| 2020/0400962 | A1* | 12/2020 | Hirano | G02C 11/06 |

FOREIGN PATENT DOCUMENTS

JP    2016-039529 A    3/2016

* cited by examiner

*Primary Examiner* — Yuzhen Shen
(74) *Attorney, Agent, or Firm* — Oliff PLC

(57) ABSTRACT

A wearable display device includes a display element, a first circuit board, a second circuit board, and an outer packaging case housing the display element, the first circuit board, and the second circuit board, wherein the second circuit board has a larger calorific value than the first circuit board, and is disposed at a further outer side, which is an opposite to a wearer than the first circuit board, in the outer packaging case.

16 Claims, 18 Drawing Sheets

WEARABLE DISPLAY DEVICE

The present application is based on, and claims priority from JP Application Serial Number 2019-056099, filed Mar. 25, 2019, the disclosure of which is hereby incorporated by reference herein in its entirety.

BACKGROUND

1. Technical Field

The present disclosure relates to a wearable display device that presents a virtual image or the like to an observer.

2. Related Art

As a wearable display device, a device that has an eyeglasses appearance, and has a built-in display panel constituted by an organic EL element or the like in an outer packaging component disposed on a head side of a wearer has been known (JP-A-2016-39529). In the device of JP-A-2016-39529, a heat dissipation sheet that dissipates heat from the display panel to a housing is provided, and a heat dissipation side of the heat dissipation sheet is adhered to, for example, an external surface side component of the housing.

In the device of JP-A-2016-39529, heat dissipation from the display panel can be efficiently achieved, and a temperature increase of the display panel can be suppressed, but there is insufficient consideration for cases in which other heat generating elements or heat sources are disposed on the outer packaging component.

SUMMARY

A wearable display device according to an aspect of the present disclosure includes a display element, a first circuit board, a second circuit board, and an outer packaging case configured to house the display element, the first circuit board, and the second circuit board, wherein the second circuit board has a greater calorific value than the first circuit board, and is disposed at a further outer side, which is an opposite side to a wearer, than the first circuit board in the outer packaging case.

DESCRIPTION OF EXEMPLARY EMBODIMENTS

An exemplary embodiment of a wearable display device according to the present disclosure will be described below with reference to the accompanying drawings.

Figure 1:
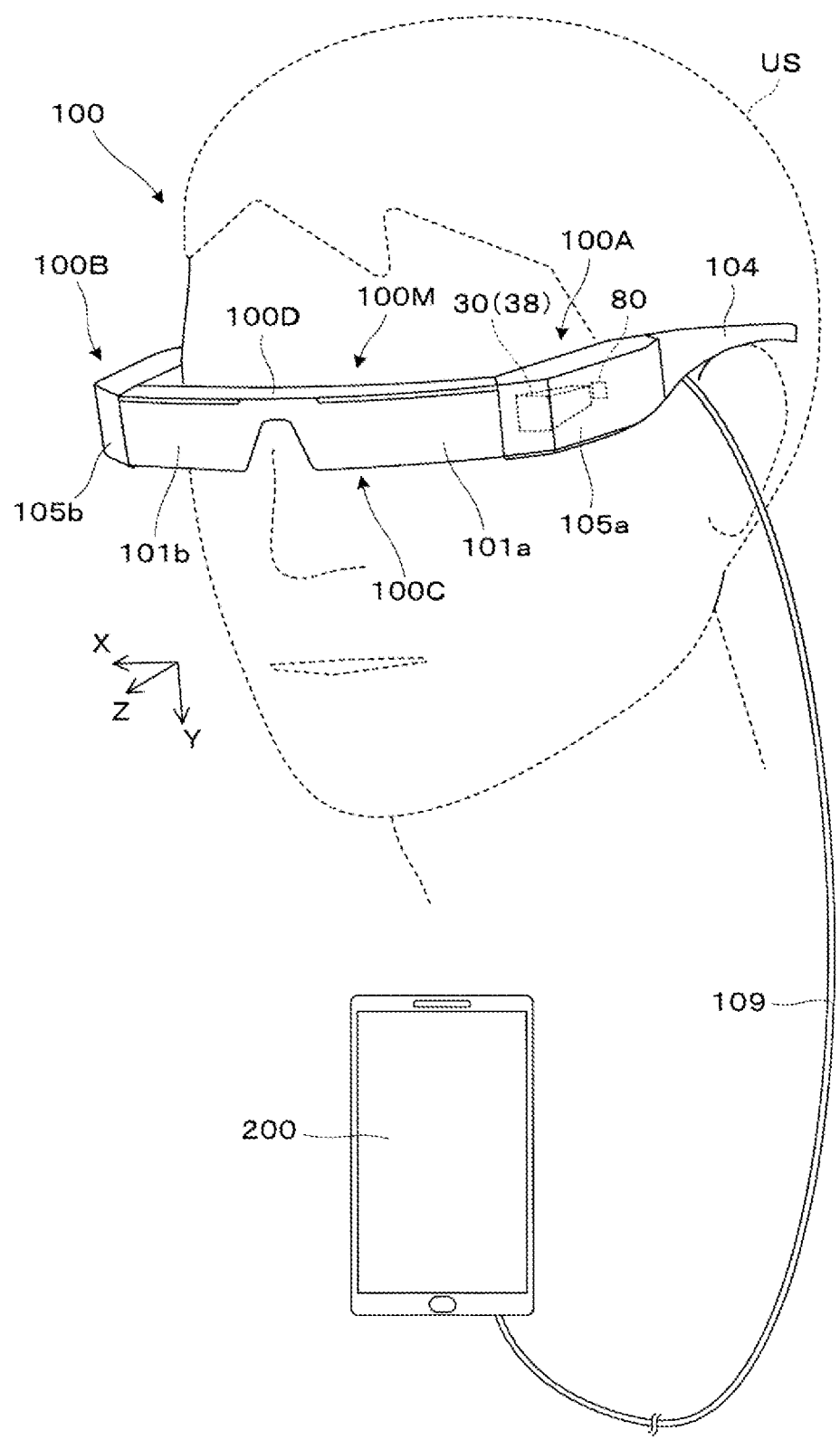
FIG. 1 is a perspective view illustrating a state of use of a wearable display device according to an exemplary embodiment.
Figure 2:
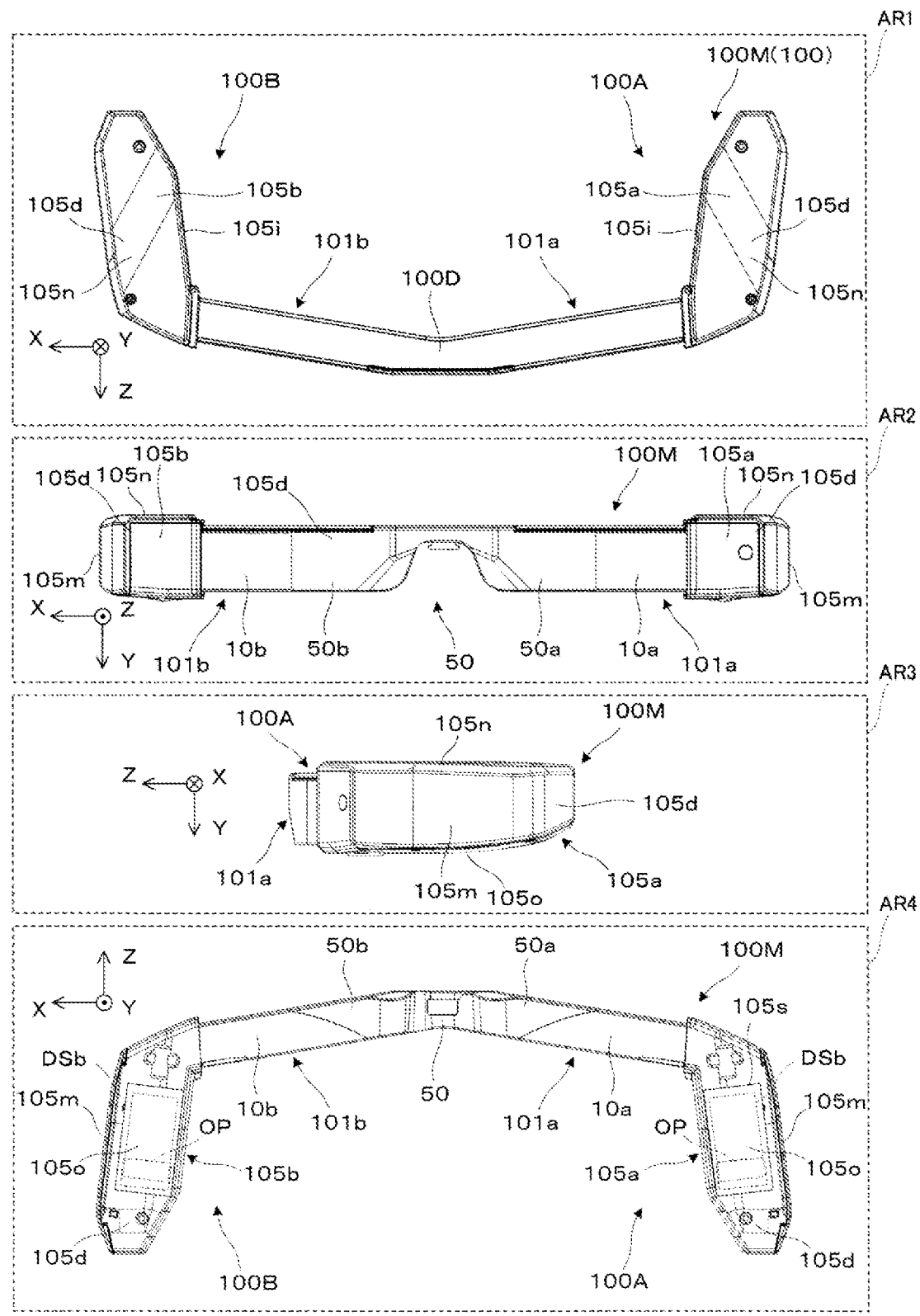
FIG. 2 is a diagram illustrating an appearance of a main portion of the wearable display device.

As illustrated in FIG. 1 and FIG. 2, a wearable display device 100 of the exemplary embodiment is a head-mounted display (HMD) having an eyeglasses-like appearance. In FIG. 1 and the like, X, Y, and Z form an orthogonal coordinate system, a+X direction corresponds to a lateral direction in which both eyes of an observer wearing the wearable display device 100 are aligned, a+Y direction corresponds to a downward direction orthogonal to the lateral direction in which both the eyes for the observer are aligned, and a+Z direction corresponds to a forward direction or front direction for the observer. In FIG. 2, a first region AR1 is a plan view of a body 100M of the wearable display device 100, a second region AR2 is a front view of the body 100M, a third region AR3 is a left side view of the body 100M, and a fourth region AR4 is a bottom view of the body 100M.

The wearable display device 100 can not only make the observer or a wearer US wearing the wearable display device 100 visually recognize a virtual image, but also observe an external world image in a see-through manner. The wearable display device 100 can be communicatively coupled to a smart phone or other external device 200 via a cable 109, and, for example, can form a virtual image corresponding to an image signal inputted from the external device 200. The wearable display device 100 is provided with a first display device 100A and a second display device 100B. The first display device 100A is a portion that forms a virtual image for a left eye, and the second display device 100B is a portion that forms a virtual image for a right eye. The first display device 100A for the left eye includes a first virtual image forming optical unit 101a that covers a front of the eye of the observer in a see-through manner, and a first image forming body unit 105a that forms imaging light. The second display device 100B for the right eye includes a second virtual image forming optical unit 101b that covers a front of the eye of the observer in a see-through manner, and a second image forming body unit 105b that forms imaging light.

A temple 104, which is a temple portion extending rearward from a side surface of a head, is rotatably attached to a rear portion of each of the first and second image forming body units 105a and 105b by a hinge (not illustrated), and secures an attachment state of the wearable display device 100 by abutting an ear, temple, or the like of the observer. Although not illustrated, a nose pad that constitutes a support portion together with the temple 104 is provided in a recess formed between the first and second virtual image forming optical units 101a and 101b, and the nose pad enables positioning of the virtual image forming optical units 101a and 101b and the like relative to the eyes of the observer.

Figure 3:
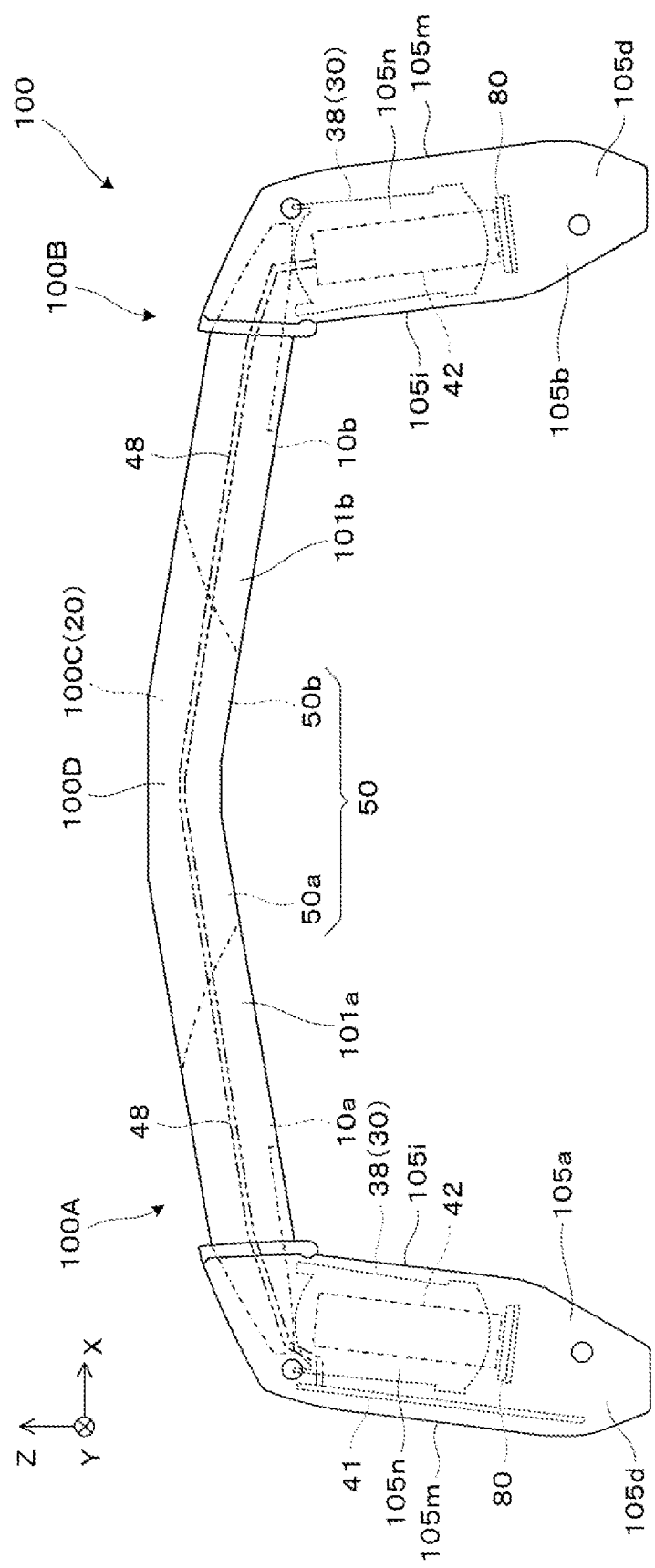
FIG. 3 is a plan view illustrating the main portion of the wearable display device.

Internal structure and the like of the wearable display device 100 will be described below with reference to FIG. 3. The first image forming body unit 105a includes a display element 80, a lens barrel 38, an electronic circuit boards 41, 42, and the like, in a cover-form outer packaging case 105d. The lens barrel 38 pertains to a projection lens 30, and holds an optical element (not illustrated) for image formation. By collectively housing the display element 80, the lens barrel 38, the electronic circuit boards 41, 42, and the like, that are small, in the outer packaging case 105d, it is possible to make the wearable display device 100 multi-functional while allowing an appearance thereof to be small and stylish. The outer packaging case 105d of the first image forming body unit 105a is sometimes referred to as a first outer packaging case 105d for distinction. The lens barrel 38, the display element 80, and the electronic circuit boards 41 and 42 are supported in the first outer packaging case 105d made of metal, and in particular, the display element 80 and the lens barrel 38 are fixed to a tip portion of the first virtual image forming optical unit 101a, in a state of being aligned. The second image forming body unit 105b includes the display element 80, the lens barrel 38, the electronic circuit board 42, and the like, in the cover-form outer packaging case 105d. The outer packaging case 105d of the second image forming body unit 105b is sometimes referred to as a second outer packaging case 105d for distinction. The lens barrel 38, the display element 80, and the electronic circuit board 42 are supported in the second outer packaging case 105d made of metal, and in particular, the display element 80 and the lens barrel 38 are fixed to a tip of the second virtual image forming optical unit 101b, in a state of being aligned.

In the first image forming body unit 105a for the left eye, the projection lens 30 or the lens barrel 38 is disposed upstream a light path with respect to the first virtual image forming optical unit 101a, to form a part of an imaging system. The projection lens 30 is disposed close to a front, or in the +Z direction in the first outer packaging case 105d. The display element 80 is a display device that forms an image corresponding to a virtual image for the left eye. The display element 80 is disposed so as to be adjacent to the projection lens 30 on a back side, that is, a −Z side in the outer packaging case 105d. The electronic circuit board 41 is a signal processing board that processes signals including information from an exterior. Here, the information from the exterior is typically image data from the external device 200. The electronic circuit board 41 has an interface function with the exterior, and manages and controls display operation of the electronic circuit board 42. The electronic circuit board 41 is a second circuit board having a relatively higher calorific value compared to the electronic circuit board 42, and is disposed on an outside (−X side), which is a counter wearer side of the electronic circuit board 42, which is a first circuit board, in the outer packaging case 105d. Furthermore, the electronic circuit board 41 is disposed on a lower side (+Y side) of the electronic circuit board 42, which is the first circuit board, in the outer packaging case 105d. Specifically, the electronic circuit board 41 is disposed on an outside of the lens barrel 38 and the display element 80, at a position close to an outer surface 105m of the outer packaging case 105d. The electronic circuit board 42 is a driving circuit board that drives the display element 80 in the first image forming body unit 105a, and operates under control of the electronic circuit board 41. The electronic circuit board 42 is the first circuit board having a relatively lower calorific value compared to the electronic circuit board 41, is disposed on an inside (+X side) that is a wearer side of the electronic circuit board 41 that is the second circuit board in the outer packaging case 105d, and is disposed on an upper side (−Y side) of the electronic circuit board 41. Specifically, the electronic circuit board 42 is disposed above the lens barrel 38, at a position close to an upper side surface 105n of the outer packaging case 105d.

In the second image forming body unit 105b for the right eye, the projection lens 30 is disposed upstream a light path with respect to the second virtual image forming optical unit 101b, to form a part of an imaging system. The projection lens 30 is disposed close to a front, or in the +Z direction in the second outer packaging case 105d. The display element 80 is a display device that forms an image corresponding to a virtual image for the right eye. The display element 80 is disposed so as to be adjacent to the projection lens 30 on the back side, that is, the −Z side in the outer packaging case 105d. Nothing exists in the second image forming body unit 105b that correspond to the electronic circuit board 41 provided in the first image forming body unit 105a. The electronic circuit board 42 is a driving circuit board that drives the display element 80 in the second image forming body unit 105b. The electronic circuit board 42 operates under control of the electronic circuit board 41 provided in the first image forming body unit 105a. The electronic circuit board 42 of the second image forming body unit 105b is, similar to the electronic circuit board 42 provided on the first image forming body unit 105a, disposed above the lens barrel 38, at a position close to the upper side surface 105n of the outer packaging case 105d.

The first and second virtual image forming optical units 101a and 101b are not separated bodies, and are coupled at a center to form a transparent light-guiding unit 100C that is an integrated member. The transparent light-guiding unit 100C includes a pair of light-guiding members 10a and 10b, and a central member 50. The pair of light-guiding members 10a and 10b are a pair of optical members that contribute to virtual image formation while propagating imaging light therein. The central member 50 has a pair of light transmission units 50a and 50b, one light transmission unit 50a is bonded to one light-guiding member 10a, and another light transmission unit 50b is bonded to another light-guiding member 10b. The transparent light-guiding unit 100C is a composite light-guiding device 20 that provides images for both the eyes to the observer by light-guiding, and is supported by the outer packaging cases 105*d* at both end portions, that is, on tip sides of the light-guiding members 10*a* and 10*b*, respectively.

An upper cover 100D is fixed to an upper surface of the transparent light-guiding unit 100C. A thin and narrow space is formed between the upper cover 100D and the transparent light-guiding unit 100C, and a signal line 48 extends therein that electrically couples the first image forming body unit 105*a* and the second image forming body unit 105*b*.

An electronic circuit constituting the wearable display device 100 will be described with reference to FIG. 4. The electronic circuit has a first circuit 40*a* and a second circuit 40*b*. The first circuit 40*a* is incorporated into the first image forming body unit 105*a* for the left eye illustrated in FIG. 3 and includes two number of the electronic circuit boards 41 and 42. The electronic circuit boards 41 and 42 are heat generating elements that consume power. The second circuit 40*b* is incorporated into the second image forming body unit 105*b* for the right eye illustrated in FIG. 3, and includes one number of the electronic circuit board 42. In the above, each of the electronic circuit boards 41 and 42 is obtained by forming wiring on a surface or in an inside of an insulating resin substrate, and has structure in which ICs and electronic elements are mounted on the surface.

The electronic circuit board 41 incorporated into the first image forming body unit 105*a* is a main substrate that controls overall operation of the wearable display device 100, and has an interface function that controls operation of the electronic circuit board 42, which is the driving circuit board, communicates with the external device 200, and performs signal conversion on signals received from the external device 200. The electronic circuit board 41 includes an arithmetic processing circuit 41*a*, a storage circuit 41*b*, and an interface circuit 41*c*. The arithmetic processing circuit 41*a* can perform data communication with the external device 200 or the like, via the interface circuit 41*c*. The arithmetic processing circuit 41*a* performs processing based on programs and data stored in the storage circuit 41*b*, data and information received via the interface circuit 41*c*, stores progress and results of the processing in the storage circuit 41*b*, displays information corresponding to the results of the processing on the display element 80 via the electronic circuit board 42, or outputs to the external device 200 via the interface circuit 41*c*. The interface circuit 41*c*, for example, converts image data inputted from the external device 200 into image data suitable for the display on the display element 80. That is, the interface circuit 41*c* performs signal conversion on the signals received from the external device 200. The data inputted from the external device 200 basically includes, digital signals of an image or a sound, but not limited thereto, and can include bi-directional control signals, network communication data, and the like. For a connector 40*c* and the cable 109 for the external device 200, specifically HDMI (registered trademark, High-Definition Multimedia Interface) is assumed, but not limited thereto, and can be made capable of supporting various communication standards. The arithmetic processing circuit 41*a* can monitor output of a sensor 47 via the interface circuit 41*c*. The sensor 47 includes, one or more of a temperature sensor, an outside light sensor, and an acceleration sensor, but not limited thereto. The electronic circuit board 41 controls an operating state of the wearable display device 100 based on monitoring information obtained from the sensor 47 via the interface circuit 41*c*.

The electronic circuit board 42 incorporated into the first image forming body unit 105*a* operates under control of the electronic circuit board 41, as a driving circuit board that drives the display element 80. Although detailed description is omitted, each the electronic circuit board 42 includes, for example, an IF circuit, a scanning driving circuit, a signal driving circuit, and the like, receives image data or image signals outputted from the electronic circuit board 41, and causes the display element 80 to perform two-dimensional image display. The electronic circuit board 42 outputs a drive signal corresponding to an image to the display element 80.

The display element 80 incorporated into the first image forming body unit 105*a* is a light-emitting display device that enables two-dimensional display, and operates in a dot-matrix manner. For each the display element 80, specifically a display panel of an organic Electro-luminescence (EL) is assumed, but not limited thereto, and a panel for a Liquid Crystal Display (LCD) may be used. When a panel for an LCD is used, a compatible light source for illumination is required. The display element 80 can be driven by the electronic circuit board 42 of the first circuit 40*a* to form a color image on a rectangular display surface, and display a two-dimensional video or still image.

Figure 5:
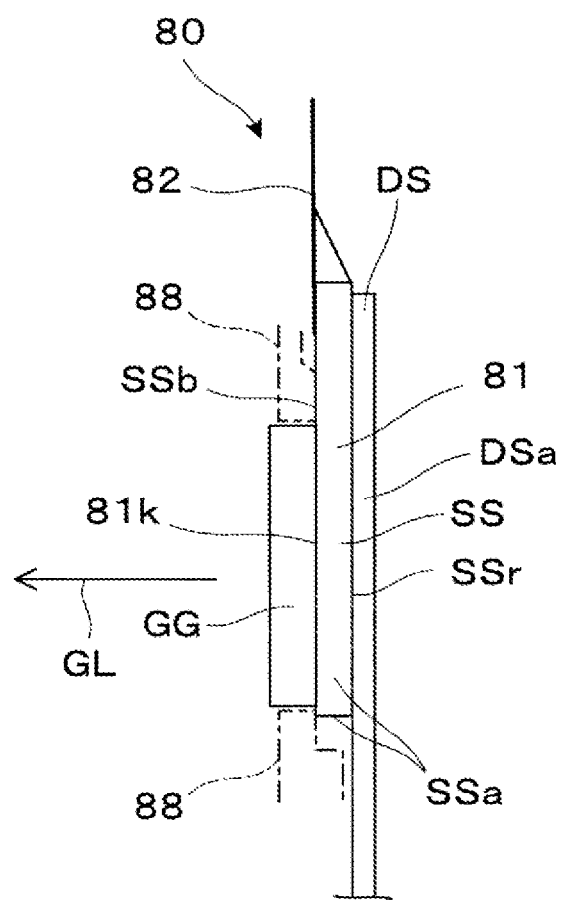
FIG. 5 is a side cross-sectional view conceptually illustrating structure of a display element.

Referring to FIG. 5, the display element 80 has a rectangular plate-like body portion 81, and a Flexible Printed Circuits (FPC) unit 82 coupled to and extending from the body portion 81. Of these, the body portion 81 includes a silicon substrate SS formed with various circuits and the like, and forms an outer shape of the body portion 81, a light emitting unit 81*k* that is an organic EL element constituted by including an organic EL material and generates color light to be imaging light, and a guard glass GG for sealing that cooperates with the silicon substrate SS to seal the light emitting unit 81*k*. The display element 80 emits imaging light GL toward the guard glass GG, by performing a light emitting operation in accordance with a drive signal received from the FPC unit 82. The display element 80 is a heat generating element, and generates heat in conjunction with exit of the imaging light GL.

The body portion 81 of the display element 80 is held by a rectangular frame-shaped case portion 88, and a side surface SSa and a surface SSb of the silicon substrate SS are used for alignment with the case portion 88. The case portion 88 is a member for aligning and fixing the display element 80 to the lens barrel 38 of the projection lens 30. The case portion 88 has a shape that exposes a back surface SSr of the silicon substrate SS. One end DSa of a heat dissipation sheet DS is directly stuck on the back surface SSr of the silicon substrate SS, for the purpose of promoting heat dissipation of the display element 80. Note that, as illustrated in FIG. 2, another end DSb of the heat dissipation sheet DS extends to an outside of the outer packaging case 105*d* via an opening OP provided in a bottom plate portion 71*a*, which is a lower portion of the outer packaging case 105*d*, and is stuck on the lower portion of the outer packaging case 105*d* (that is, a lower side surface 105*o* of the bottom plate portion 71*a*). The heat dissipation sheet DS is formed from a heat conductive tape having high heat conductivity, and is specifically formed from a graphite sheet. The heat dissipation sheet DS has a function of efficiently transmitting heat generated in the display element 80 to a surface of the outer packaging case 105*d*. The graphite sheet is artificial graphite in which two dimensionally crystallized carbon is stacked in layers, is thin and has high heat conductivity (see JP-A-2016-39529). When the display element 80 is applied to an HMD to form a high luminance image, the display element itself becomes a heat source, and a temperature increase is likely to be problematic. In particular, when the display panel of the organic EL is used as the display element 80 as in the present exemplary embodiment, performance deterioration and shortening of life due to the temperature increase may be significant according to a property thereof. In the present exemplary embodiment, the back surface SSr of the display element 80 and the lower side surface 105o of the outer packaging case 105d are directly coupled by the heat dissipation sheet DS, thus efficient heat dissipation of the display element 80 is enabled, and, performance maintenance of the display element 80 can be ensured, and an operating life can be increased. When the graphite sheet is used as the heat dissipation sheet DS, the thin heat dissipation sheet DS can be disposed with a high degree of bending freedom, and high heat dissipation efficiency can be achieved. Heat conductivity along a main surface of the graphite sheet can be set to, for example, not less than 600 W/(m·K), and can be set to approximately 1500 W/(m·K), for example.

The electronic circuit board 42 incorporated into the second image forming body unit 105b has similar structure to that of the electronic circuit board 42 incorporated into the first image forming body unit 105a, and operates under control of the electronic circuit board 41, as a driving circuit board that drives the display element 80 provided in the second image forming body unit 105b. The display element 80 incorporated into the second image forming body unit 105b has similar structure to that of the display element 80 incorporated into the first image forming body unit 105a, and the display element 80 is cooled by the heat dissipation sheet DS. In the case of the second image forming body unit 105b, the electronic circuit board 41 is not included.

Figure 6:
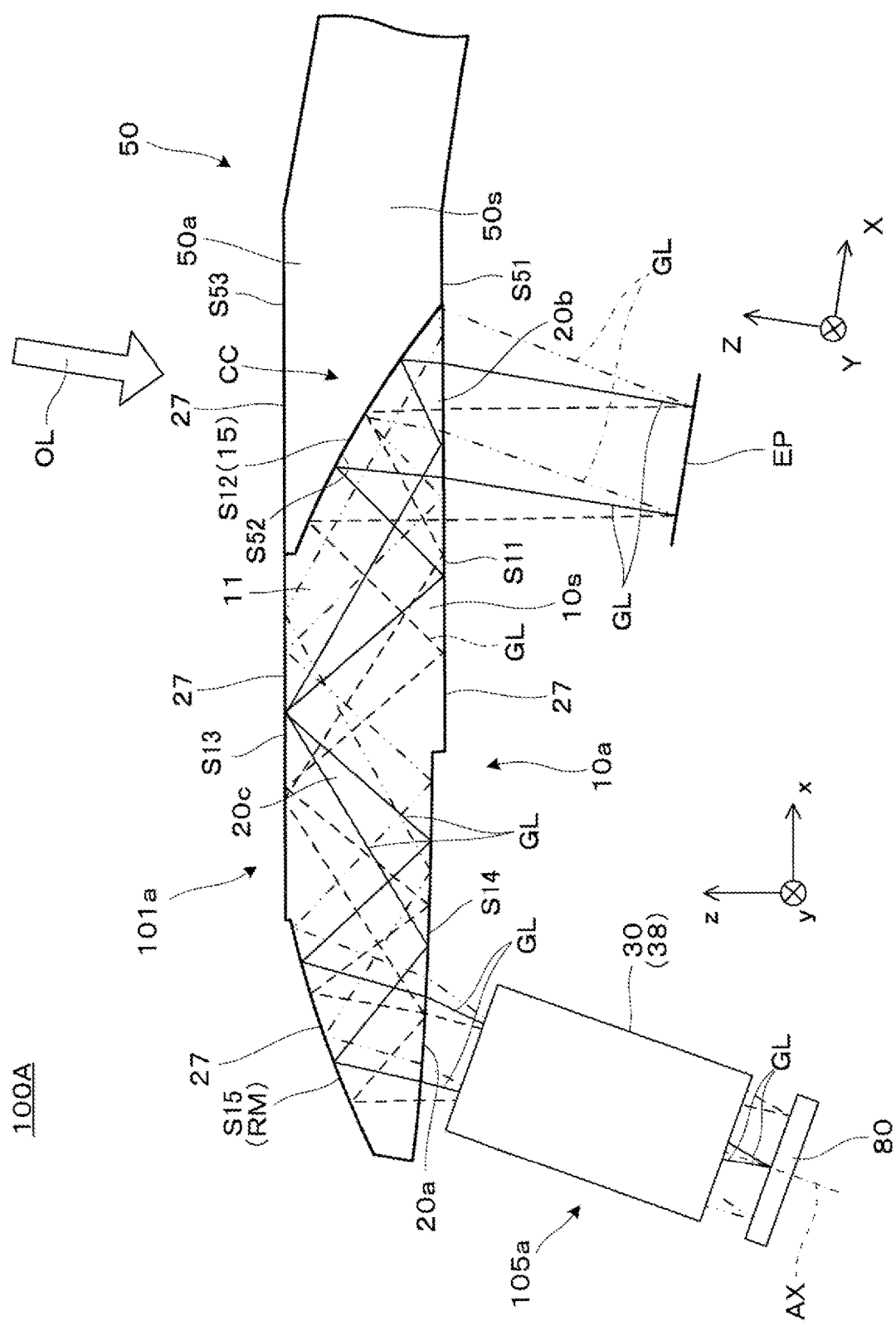
FIG. 6 is a plan view illustrating optical structure of a first virtual image forming optical unit.

FIG. 6 is a diagram illustrating a portion of the first display device 100A, and particularly describes optical structure of the first virtual image forming optical unit 101a. As described above, the wearable display device 100 is constituted by the first display device 100A and the second display device 100B (see FIG. 1), but since the first display device 100A and the second display device 100B each have a left-right symmetric and equivalent structure, only the first display device 100A will be described, and description of the second display device 100B will be omitted. Note that, in FIG. 6, x, y, and z form an orthogonal coordinate system, an x direction and a y direction are parallel to a first surface S11 and a third surface S13, and a z direction is perpendicular to the first surface S11 and third surface S13.

The light-guiding member 10a of the first virtual image forming optical unit 101a is bonded to the light transmission unit 50a via an adhesive layer CC. The light-guiding member 10a and the light transmission unit 50a have structure in which respective surfaces of body members 10s and 50s are covered with a hard coat layer 27. The body member 10a of the light-guiding member 10a is formed from a resin material with high optical transparency in a visible range, and is molded, for example, by pouring a thermoplastic resin into a mold and curing the resin. The same applies to the light transmission unit 50a or the central member 50, and the body member 50s is formed of an identical material to that of the main body member 10s of the light-guiding member 10a.

Below, an outline of a light path of the imaging light GL will be described. The light-guiding member 10a guides the imaging light GL exited from the projection lens 30 toward the eye of the observer, by reflection at the first surface S11 to a fifth surface S15, and the like. Specifically, the imaging light GL from the projection lens 30 is first incident on a portion of the fourth surface S14 formed at a light incidence part 20a and reflected by the fifth surface S15 that is an inner surface of a reflection film RM, is incident on again from an inside and totally reflected by the fourth surface S14, is incident on and totally reflected by the third surface S13, and is incident on and totally reflected by the first surface S11. The imaging light GL totally reflected by the first surface S11 is incident on the second surface S12, is partially reflected while partially passing through a half mirror 15 provided on the second surface S12, and is once more incident on and passes through a portion of the first surface S11 formed at a light emitting part 20b. The imaging light GL passed through the first surface S11 is incident, as a substantially parallel luminous flux, on an exit pupil EP on which the eye of the observer is placed. In other words, the observer is to observe an image by the imaging light as a virtual image.

The first virtual image forming optical unit 101a, causes the observer to visually recognize the imaging light by the light-guiding member 10a, and also, in a state in which the light-guiding member 10a and the light transmission unit 50a are combined, causes the observer to observe an external world image having little distortion. At this time, since the third surface S13 and the first surface S11 are planes that are substantially parallel to each other (diopter is approximately 0), almost no aberration or the like occurs in external light OL. Further, a third transmission surface S53 and a first transmission surface S51 are planes that are substantially parallel to each other. Furthermore, since the third transmission surface S53 and the first surface S11 are the planes that are substantially parallel to each other, almost no aberration or the like occurs. As described above, the observer is to observe the external world image that has no distortion through the light transmission unit 50a.

Figure 7:
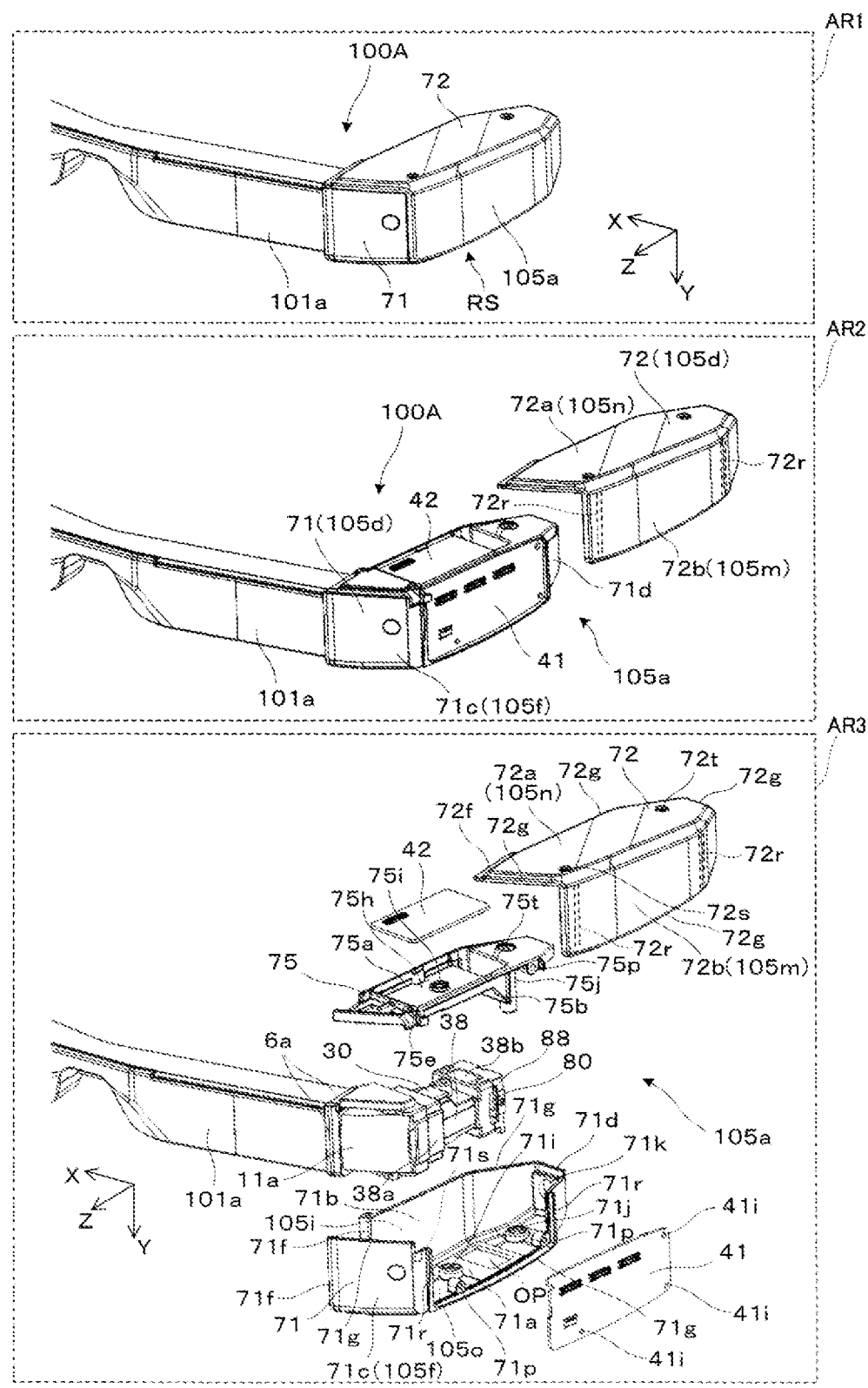
FIG. 7 is a perspective view illustrating an appearance and internal structure of a first image forming body unit.

Internal structure of the first image forming body unit 105a will be described with reference to FIG. 7. In FIG. 7, the first region AR1 is a perspective view of the first display device 100A, the second region AR2 is a partially exploded perspective view illustrating a state in which a second member 72 is removed from the outer packaging case 105d, and the third region AR3 illustrates a state in which the outer packaging case 105d, the electronic circuit boards 41 and 42 are separated.

Figure 8:
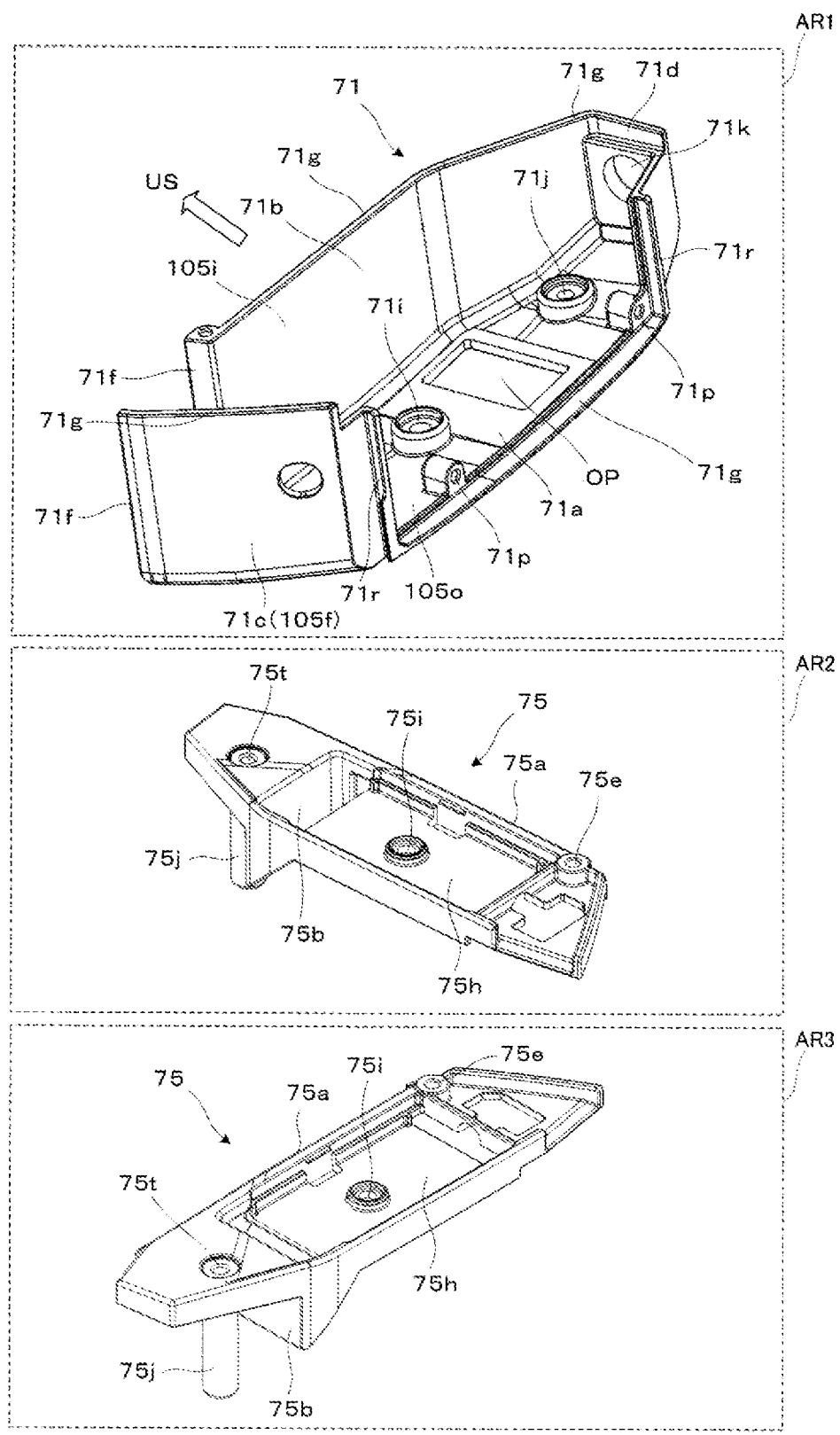
FIG. 8 is a perspective view illustrating an outer packaging case and a circuit board holder of the first image forming body unit.

The outer packaging case 105d includes a first member 71, which is a lower member, and the second member 72, which is an upper member. By aligning and fixing the first member (lower member) 71 and the second member (upper member) 72, an internal space for housing components can be formed. As illustrated in the first region AR1 in FIG. 8, the first member 71 is an integral component having the bottom plate portion 71a that forms the lower side surface 105o, an inner plate portion 71b that forms an inner surface 105i, a front plate portion 71c that forms a front side surface 105f, and a back wall portion 71d that forms an appearance of a rear portion. The first member 71 is cast from, for example, a magnesium alloy. The second member 72 is an integral component having a top plate portion 72a that forms the upper side surface 105n, and an outer plate portion 72b that forms the outer surface 105m. The second member 72 is also cast from, for example, a magnesium alloy. In the above, the bottom plate portion 71a and the inner plate portion 71b of the first member 71 are two side surface portions that form an angle close to a right angle and are coupled to each other, and the top plate portion 72a and the outer plate portion 72b of the second member 72 are two side portions that form an angle close to a right angle and are coupled to each other. The inner plate portion 71b is referred to as a first side surface portion on a wearing side, and the outer plate portion 72b is referred to as a second side surface portion on a counter wearing side. Here, the bottom plate portion 71a of the first member 71, the inner plate portion 71b of the first member 71, the top plate portion 72a of the second member 72, and the outer plate portion 72b of the second member 72 are a plurality of the side surface portions that surround the columnar outer packaging case 105d, and as a whole, form a peripheral side surface RS of the outer packaging case 105d. In other words, the outer packaging case 105d has a box shape that surrounds the display element 80, the electronic circuit boards 41, 42, the lens barrel 38, and the like from upper, lower, inner, and outer sides. A magnesium alloy forming the outer packaging case 105d includes aluminum, zinc, and the like in addition to magnesium. Since formed from the magnesium alloy, the outer packaging case 105d can achieve high heat conductivity while being lightweight (for example, 50 to 100 W/(m·K)), and heat dissipation of the electronic circuit boards 41, 42 and the display element 80 via the outer packaging case 105d can be made effective.

A circuit board holder 75 that holds the electronic circuit boards 41 and 42 is fixed inside the outer packaging case 105d. The circuit board holder 75 is a molded product of a resin material, and has heat shielding properties, compared to the outer packaging case 105d. The circuit board holder 75, as also illustrated in the second region AR2 and the third region AR3 in FIG. 8, includes a plate-like portion 75a and a partition wall portion 75b. The circuit board holder 75, in the outer packaging case 105d, by partitioning an inner space of the outer packaging case 105d, forms a layered upper space proximate to the top plate portion 72a of the second member 72, a layered outer space proximate to the outer plate portion 72b of the second member 72, and a back space surrounded by the back wall portion 71d of the first member 71. The electronic circuit board 41, which is the main substrate, is supported by the plate-like portion 75a and the partition wall portion 75b, and is housed in the outer space described above. The electronic circuit board 42, which is the driving circuit board, is supported by the plate-like portion 75a, and is housed in the upper space described above. In this way, by using the circuit board holder 75, an arrangement of the electronic circuit boards 41 and 42 in the outer packaging case 105d can be freely set. In addition, an extent to which heat dissipation from the electronic circuit boards 41 and 42 affects the display element 80 can be suppressed by the circuit board holder 75.

Explaining a fixing method, the lens barrel 38 of the projection lens 30 is fixed to a tip portion 11a of the first virtual image forming optical unit 101a, at a forward tip 38a, in a state of being aligned by using screws or the like. The case portion 88 that holds the display element 80 is fixed to a backward tip 38b of the lens barrel 38 by using engagement structure or an adhesive material. The lens barrel 38 that supports the display element 80 is fixed to the first member 71 of the outer packaging case 105d together with the tip portion 11a of the first virtual image forming optical unit 101a with a screw (not illustrated), by using an insertion hole 71i provided in the first member 71. A band-shaped seal portion 6a is stuck on a periphery of the tip portion 11a of the first virtual image forming optical unit 101a. The seal portion 6a is made from a silicone rubber having water repellency, and in a state in which the first virtual image forming optical unit 101a is fixed to the outer packaging case 105d, is in close contact with an opening frame portion 71f provided in the first member 71 and an opening frame portion 72f provided in the second member 72, and keeps an inside of the outer packaging case 105d airtight. The circuit board holder 75 is fixed to the lens barrel 38 with a screw (not illustrated) by using an insertion hole 75i provided therein, and is supported by the outer packaging case 105d via the lens barrel 38. In addition, the circuit board holder 75 is supported by the outer packaging case 105d with a screw (not illustrated), by using a columnar boss 75j provided thereon, and an insertion hole 71j provided in the first member 71. The electronic circuit board 41 is fixed to the circuit board holder 75 with a screw (not illustrated) by using a screw hole 75p provided in the circuit board holder 75, at one of three insertion holes 41i, and is fixed to the first member 71 with a screw (not illustrated) by using two screw holes 71p provided in the first member 71, at remaining two of the three insertion holes 41i. The electronic circuit board 42 is inserted into a recessed portion 75h provided in the circuit board holder 75, and fixed to the circuit board holder 75 by snap fitting. The first member 71 has a pair of slide guides 71r that are grooves or projecting lines, at an edge on the −X side or an outside of the front plate portion 71c, and at an edge on an outside of the back wall portion 71d respectively, and the second member 72 has a pair of slide guides 72r that are respective inward steps or grooves on an inside on the outer plate portion 72b. The slide guides 71r and 72r allow the first member 71 and the second member 72 to slide and move relative to the vertical±Y direction. A portion that allows movement only in the ±Y direction and limits movement in the −X direction can be formed only at a lower end side of each of the slide guides 71r and 72r, that is, a portion close to the bottom plate portion 71a. By sliding the second member 72 and pushing into a side of the first member 71, the first member 71 and the second member 72 are combined together as a whole to form a case (see the first region AR1 in FIG. 7). In other words, the sliding guides 71r and 72r have slide fitting waterproof structure in which the first member (lower member) 71 and the second member (upper member) 72 are slid in the vertical direction and coalesced. With the first member 71 and the second member 72 combined together as the case, an outer edge 71g of the bottom plate portion 71a provided on the first member 71 is in close contact with an outer edge 72g at a lower edge of the outer plate portion 72b provided in the second member 72. Similarly, the outer edge 71g at an upper end of the front plate portion 71c provided on the first member 71 is in close contact with the outer edge 72g on a front side of the top plate portion 72a provided in the second member 72, and the outer edge 71g at an upper end of the inner plate portion 71b and the back wall portion 71d provided on the first member 71 is in close contact with the outer edges 72g on an inside and a back side of the top plate portion 72a provided on the second member 72. The second member 72 is fixed, by using an insertion hole 72s provided therein and an insertion hole 75e of the circuit board holder 75, to the first member 71 at a position of a screw hole 71s with a screw (not illustrated). The second member 72 is fixed to, by using an insertion hole 72t provided therein, the circuit board holder 75 at a position of a screw hole 75t with a screw (not illustrated), and is supported by the outer packaging case 105d via the circuit board holder 75. Although detailed description is omitted, a seal member can be provided between respective bonding surfaces of the outer edge 71g of the first member 71 and the outer edge 72g of the second member 72 or at a place adjacent thereto, and air tightness can be increased by such a seal member. By providing the structure described above, when the screws are removed, the first member 71 and the second member 72 can be separated, the circuit board holder 75 can be removed from the first member 71, the electronic circuit boards 41 42, the lens barrel 38, or the like can be removed, and conversely re-assembly can be performed. Openable/closeable structure described above makes it relatively easy to replace, and the like, of the electronic circuit boards 41, 42, the lens barrel 38.

Figure 9:
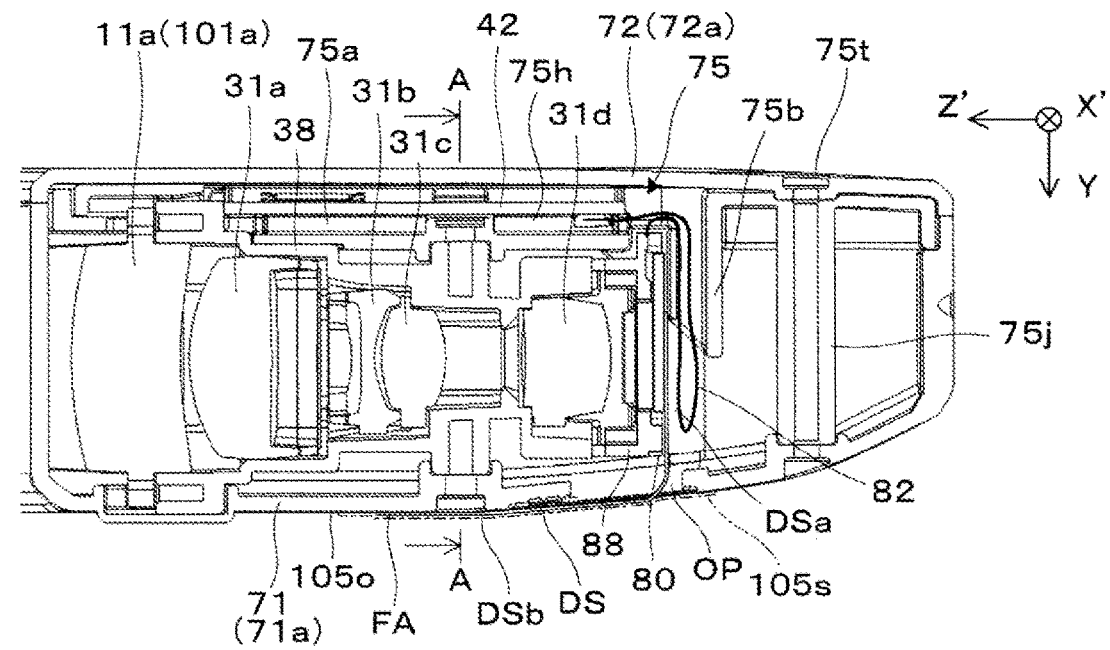
FIG. 9 is a side cross-sectional view of the first image forming body unit.
Figure 10:
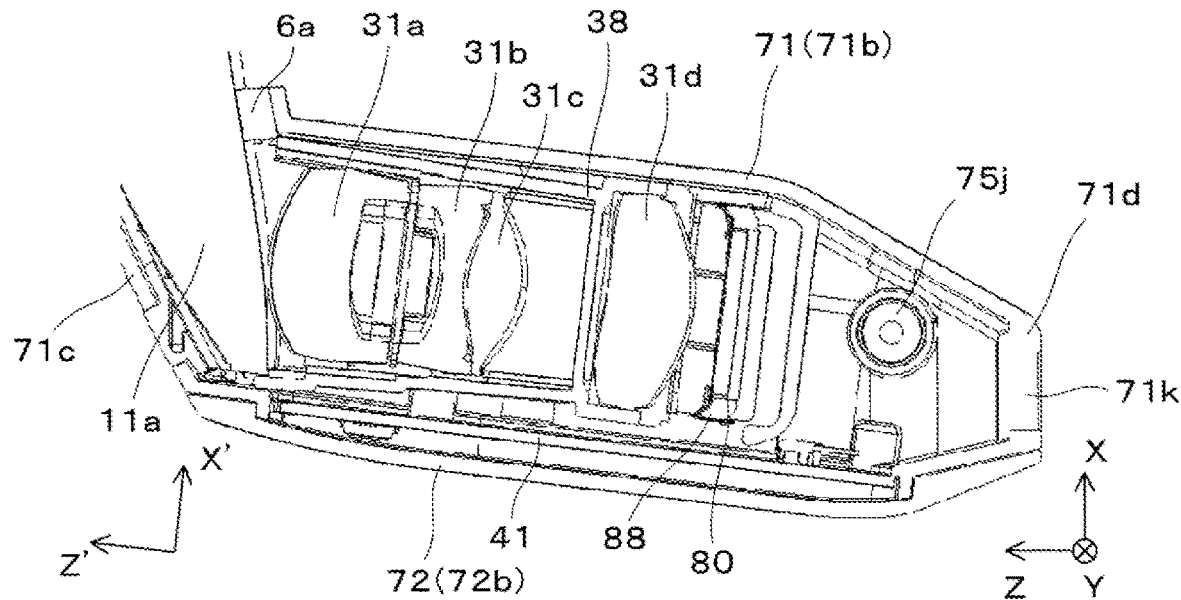
FIG. 10 is a plan cross-sectional view of the first image forming body unit.
Figure 11:
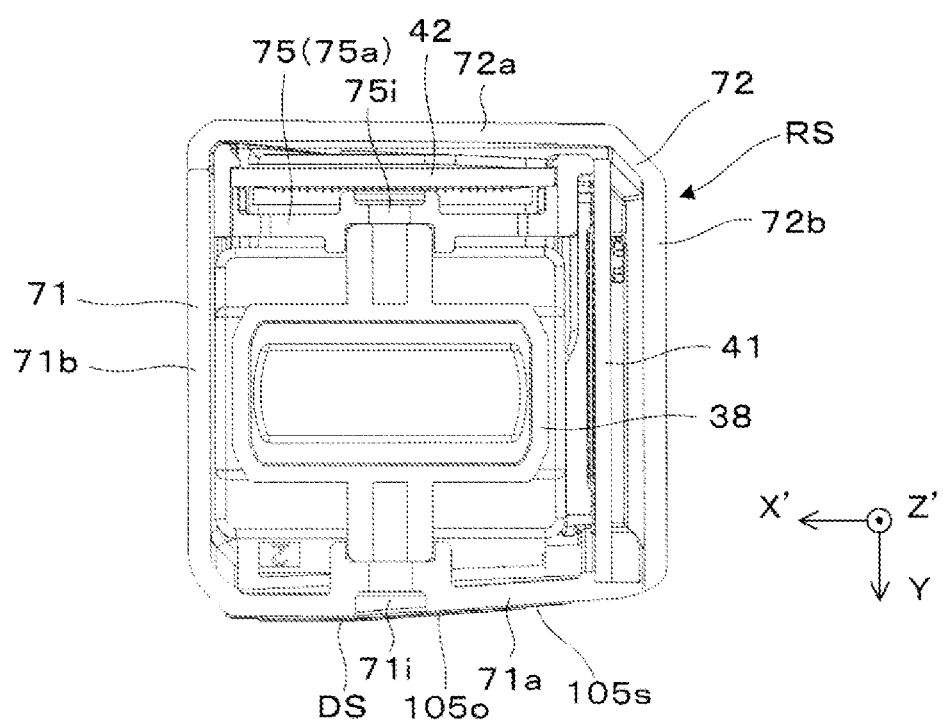
FIG. 11 is a lateral cross-sectional view of the first image forming body unit.

With reference to FIGS. 9 to 11, cross-sectional structure in the outer packaging case 105*d* of the first virtual image forming optical unit 101*a* will be described. FIG. 9 is a cross-sectional view along a longitudinal direction of the first virtual image forming optical unit 101*a*, FIG. 10 is an XZ cross-sectional view of the first virtual image forming optical unit 101*a*, and FIG. 11 is a cross-sectional view taken along a line AA in FIG. 9. In FIG. 9 and the like, X' and Z' are coordinates with reference to a longitudinal direction of the outer packaging case 105*d*.

In the outer packaging case 105*d*, a first lens 31*a* held by the lens barrel 38 of the projection lens 30 is disposed, so as to be opposite to the tip portion 11*a* of the first virtual image forming optical unit 101*a*. The first lens (optical element) 31*a* to a fourth lens (optical element) 31*d* are held in the lens barrel 38 as optical elements for image formation. The display element 80 is supported by the case portion 88, aligned and disposed, in a state of being proximate to the fourth lens 31*d* of the projection lens 30. The electronic circuit board 41, which is the main substrate, is supported by the circuit board holder 75, and is disposed in a state of being adjacent to the outer plate portion (side surface portion) 72*b* of the second member 72. Here, a state in which the electronic circuit board 41 is adjacent to the outer plate portion (side surface portion) 72*b* includes, a case of being separated and aligned, and a case of laterally contacting, in addition to a case of opposing so as to contact each other. These arrangements enable efficient heat dissipation from the electronic circuit board (second circuit board) 41 to the outer plate portion (side surface portion) 72*b*, thereby enabling efficient cooling of the electronic circuit board 41. The electronic circuit board 42, which is the driving circuit board, is supported by the circuit board holder 75, and is disposed in a state of being adjacent to the top plate portion (side surface portion) 72*a* of the second member 72. Here, a state in which the electronic circuit board 42 is adjacent to the top plate portion (side surface portion) 72*a* includes, a case of being separated and aligned, and a case of laterally contacting, in addition to a case of opposing so as to contact each other. These arrangements enable efficient heat dissipation from the electronic circuit board (first circuit board) 42 to the top plate portion (side surface portion) 72*a*, thereby enabling efficient cooling of the electronic circuit board 41. The heat dissipation sheet DS stuck on a back surface of the display element 80 via a heat conductive adhesive or a sticking material is to conduct heat from the display element 80 to the outer packaging case 105*d*. The heat dissipation sheet DS extends outward the outer packaging case 105*d*, rather than inward the outer packaging case 105*d*, via the opening OP provided in the outer packaging case 105*d*. The opening OP is formed in the bottom plate portion 71*a*, which is a lower portion of a side surface portion of the outer packaging case 105*d*. This makes the opening OP less noticeable. The heat dissipation sheet DS is pulled out from the opening OP and extends forward. The other end DSb of the heat dissipation sheet DS is formed by adhering a heat conductive adhesive or a sticking material on an inside thereof, and is stuck on a front portion FA of the lower side surface 105*o* in a two-dimensionally and widely close contact state. The cable 109 (see FIG. 1) coupled to the electronic circuit board 41 passes through an opening 71*k* formed in the back wall portion 71*d* of the first member 71. The cable 109, the opening 71*k*, and a gap are easily sealed by a water repellent rubber bushing (not illustrated).

Figure 12:
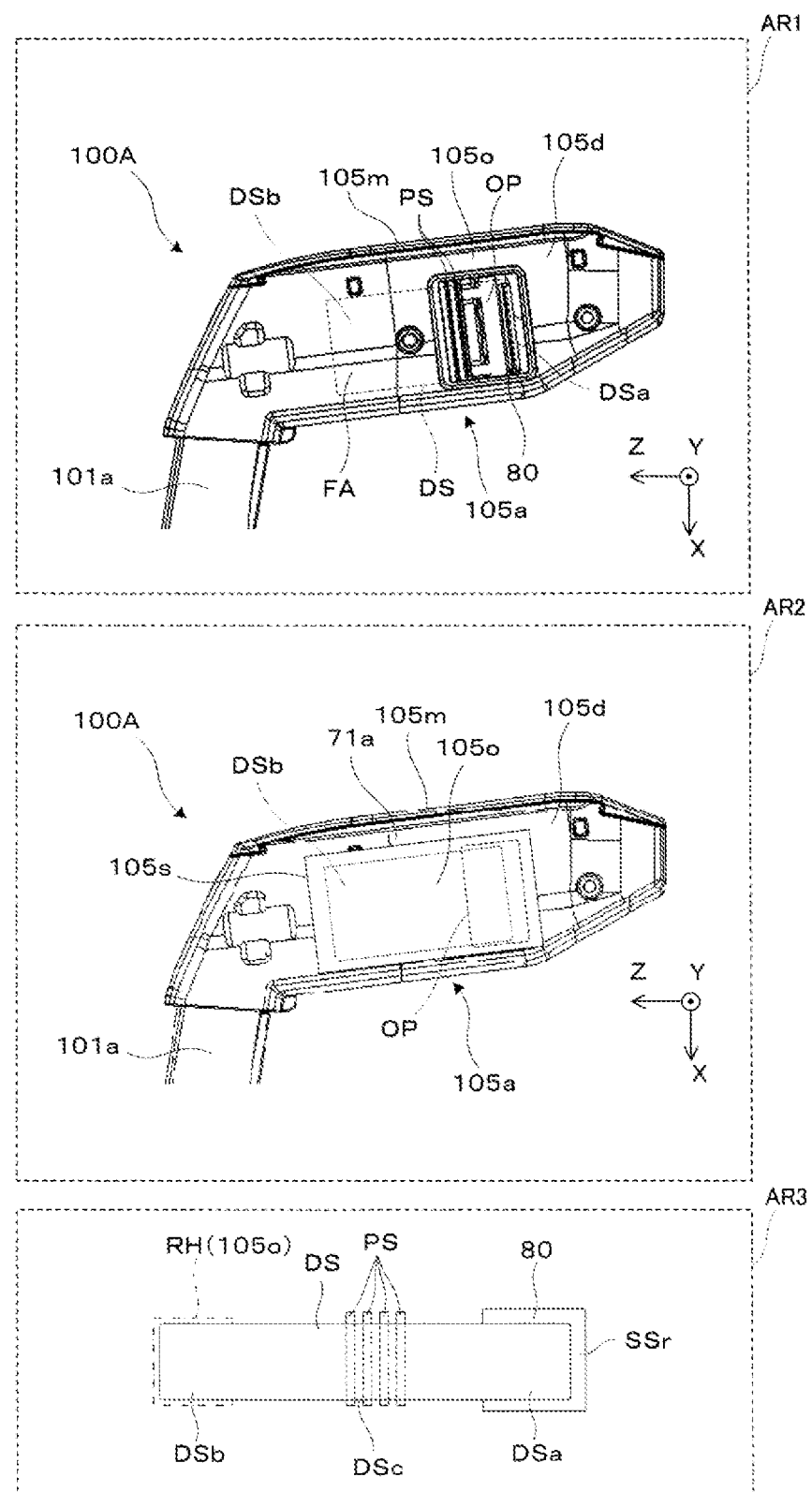
FIG. 12 is a diagram illustrating disposition and sealing of a heat dissipation sheet.

With reference to FIG. 12, disposition and sealing of the heat dissipation sheet DS will be described in detail. In FIG. 12, the first region AR1 illustrates a state in which a substrate of the bottom plate portion 71*a* of the outer packaging case 105*d* is exposed, the second region AR2 illustrates a state in which the bottom plate portion 71*a* of the outer packaging case 105*d* is covered with a waterproof tape 105*s*, and the third region AR3 is a conceptual diagram for explaining a function of the heat dissipation sheet DS.

The opening OP provided in the bottom plate portion 71*a* of the outer packaging case 105*d* is one size larger than a size of a cross-section of the heat dissipation sheet DS. Accordingly, the heat dissipation sheet DS can be passed through the opening OP without forcing, and workability of assembling the heat dissipation sheet DS is improved. The heat dissipation sheet DS is fixed to the display element 80 at the one end DSa, and is fixed to the lower side surface (side surface) 105*o* of the outer packaging case 105*d* at the other end DSb. In other words, the one end DSa of the heat dissipation sheet DS is stuck on the back surface SSr of the display element 80, and the other end DSb of the heat dissipation sheet DS is stuck on the lower side surface 105*o* of the outer packaging case 105*d*. In this case, the heat dissipation sheet DS is fixed so as to be bridged over from the display element 80 to the lower side surface 105*o* of the outer packaging case 105*d*, and heat of the display element 80 can be propagated to the lower side surface 105*o* of the outer packaging case 105*d* along a main surface of the heat dissipation sheet DS. Note that, as the other end DSb of the heat dissipation sheet DS is separated farther from the one end DSa, the display element 80, which is a heat source, is separated from a heat dissipation point RH on the lower side surface 105*o*, and a thermal gradient can be increased, so a cooling effect by the heat dissipation sheet DS is enhanced. The opening OP and the heat dissipation sheet DS are covered with and sealed by the waterproof tape 105*s*. The waterproof tape 105*s* is a water-impermeable sheet in which one side is a pressure sensitive surface, and is in close contact with, bonded to, and fixed in an airtight manner to, the lower side surface 105*o* of the outer packaging case 105*d*. Around the opening OP of the bottom plate portion 71*a*, a plurality of raised sections PS or grooves are formed as periodic unevenness at a portion where a central portion DSc of the heat dissipation sheet DS contacts. The raised sections PS can reduce a contact area between the lower side surface (side surface) 105*o* of the outer packaging case 105*d* and the heat dissipation sheet DS, and it is possible to prevent reduction of the cooling effect due to heat dissipation occurring in a place of the heat dissipation sheet DS close to the display element 80. In other words, the central portion DSc of the heat dissipation sheet DS can be prevented from coming into contact with the bottom plate portion 71*a*, heating the portion, and lowering a temperature gradient, heat flow from the one end DSa to the other end DSb of the heat dissipation sheet DS is promoted, and efficient heat dissipation is enabled at the other end DSb in a region distanced from the one end DSa. When heat is conducted along a surface direction of the heat dissipation sheet DS, heat transfer can be made faster as the heat dissipation sheet DS is thinner, but as the heat dissipation sheet DS is thicker, heat capacity can be increased to increase an amount of heat transfer. A thickness of the heat dissipation sheet DS is set in consideration of a calorific value of the display element 80. Note that, the heat dissipation sheet DS is not limited to one having a uniform thickness and width, and may be one having different thicknesses and widths at the ends DSa, DSb and the central portion DSc.

When the heat dissipation sheet DS is a conductive material such as a graphite sheet, the heat dissipation sheet DS can have a function of electromagnetic shielding. In the case of the exemplary embodiment, the heat dissipation sheet DS spreads so as to close the opening OP, and is disposed so as to contribute to electromagnetic shield. In this case, an electromagnetic shielding function of the outer packaging case 105d and the like can be enhanced, to protect circuits and the like inside and outside the outer packaging case 105d.

Figure 13:
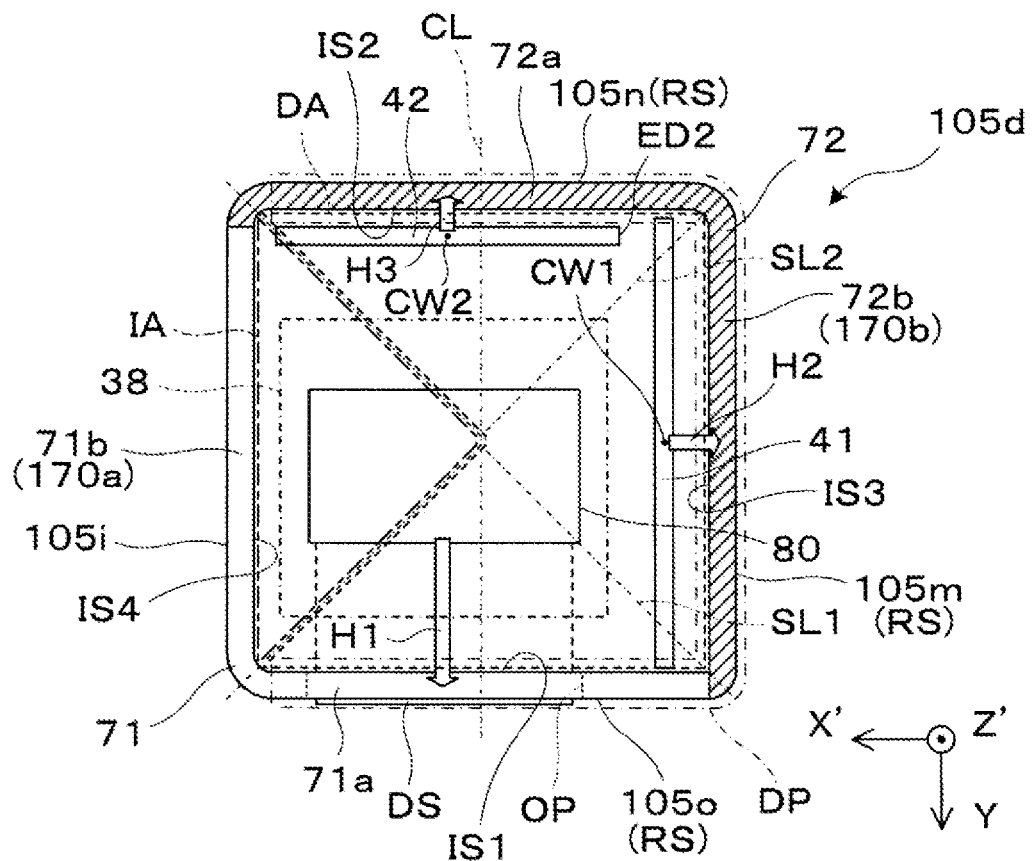
FIG. 13 is a conceptual cross-sectional view illustrating heat dissipation in the first image forming body unit.

With reference to FIG. 13, heat dissipation in the first virtual image forming optical unit 101a will be described. Of heat sources housed in the outer packaging case 105d, a calorific value of the display element 80 is lowest, and of the electronic circuit boards 41 and 42, a calorific value of the electronic circuit board 41, which is the main substrate, is larger than that of the electronic circuit board 42, which is the driving circuit board. In this case, it can be said that the electronic circuit board (signal processing board) 41 is prone to generate heat due to a load of signal processing. In a specific example, power consumption of the display element 80 is, for example, approximately 0.2 to 0.5 W, and the calorific value also corresponds to the power consumption of 0.2 to 0.5 W, and power consumption of the electronic circuit board 42 is approximately 0.5 to 1 W, the calorific value also corresponds to the power consumption of 0.5 to 1 W, and power consumption of the electronic circuit board 41 is approximately 1.5 to 2 W, and the calorific value also corresponds to the power consumption of 1.5 to 2 W. In other words, the calorific value of the display element 80 is the lowest, and the calorific value of the electronic circuit board 42 is larger than the calorific value of the display element 80, and the calorific value of the electronic circuit board 41 is larger than the calorific value of the electronic circuit board 42. Often approximately $\Delta t = 20°$ C., where $\Delta t$ is a tolerance temperature difference of the display element 80. Heat H1 from the display element 80 that needs to be maintained in a state of being the lowest temperature and being stable is transmitted to the lower side surface 105o of the bottom plate portion (lower portion) 71a disposed at a lower end of the outer packaging case 105d via the heat dissipation sheet DS, and spreads into the front plate portion 71c, the back wall portion 71d, and the like. Accordingly, the display element 80 can be efficiently cooled. At this time, the heat H1 passed through the bottom plate portion 71a is easily transmitted to the front plate portion 71c, the back wall portion 71d, and the like located relatively above. Heat H2 from the electronic circuit board 41 having a relatively large calorific value is transmitted to the outer plate portion 72b disposed on an outside or at a right end of the outer packaging case 105d primarily as radiant heat, and spreads across an entirety of the second member 72, but is transmitted to the first member 71 to a limited extent. Heat H3 from the electronic circuit board 42 having a relatively small calorific value is transmitted to the top plate portion 72a disposed on an upper side of the outer packaging case 105d primarily as radiant heat, and spreads across the entirety of the second member 72. Here, the heat H2 from the electronic circuit board 41 and the heat H3 from the electronic circuit board 42 are larger in comparison to the heat H1 from the display element 80, and heat the second member 72 to a relatively high temperature, but the first member 71 is maintained at a relatively low temperature. As a result, a temperature of the inner plate portion 71b is considerably lower than a temperature of the outer plate portion 72b, and it is possible to reliably reduce a possibility of providing a thermal discomfort to the wearer US.

As illustrated in FIG. 13, the electronic circuit board 41, which is the second circuit board, is disposed closer to the outer plate portion 72b or second side surface portion 170b on an outside than the electronic circuit board 42, which is the first circuit board, in the outer packaging case 105d. Here, an arrangement relationship of the electronic circuit boards 41 and 42 is considered based on centroid positions CW1 and CW2 of the respective substrates. In other words, the centroid position CW1 of the electronic circuit board 41 is on a −X' side of the centroid position CW2 of the electronic circuit board 42. More preferably, the electronic circuit board 41, which is the second circuit board, is disposed on an outside, that is, closer to the outer plate portion 72b, than an outer end ED2 of the electronic circuit board 42, which is the first circuit board, in the outer packaging case 105d. By disposing the electronic circuit board 41, which is a source of larger heat, on the outside, it is possible to suppress occurrence of a relative increase in temperature in the inner plate portion 71b of the first member 71, that is, the first side surface portion 170a.

The electronic circuit board 41, which is the second circuit board, is disposed on a lower side, that is, closer to the bottom plate portion 71a, of the electronic circuit board 42, which is the first circuit board, in the outer packaging case 105d. In other words, the centroid position CW1 of the electronic circuit board 41 is on a+Y side of the centroid position CW2 of the electronic circuit board 42. By disposing the electronic circuit board 41, which is a source of larger heat, on the lower side, heat diffusion efficiency in the second member 72 can be increased, and heat of the second member 72 can be efficiently dissipated.

The electronic circuit boards 41 and 42 are disposed and relatively distanced from the inner plate portion (inner portion) 71b of the first member 71. In other words, the electronic circuit boards 41 and 42 are disposed on a side of the outer plate portion 72b of a reference surface SL1 that is equidistant from the inner plate portion 71b of the first member 71 and the top plate portion 72a of the second member 72, or the electronic circuit board 41 is disposed on a side of the outer plate portion 72b of the second member 72 of a reference surface SL2 that is equidistant from the inner plate portion 71b and the bottom plate portion 71a of the first member 71. That is, the electronic circuit boards 41 and 42 are disposed, in the outer packaging case 105d, in a region relatively distanced from the inner plate portion (inner portion) 71b, that is, in a non-inner region DA that is biased to an outside, upper side, or lower side indicated by a dashed line. The non-inner region DA is a region on a non-wearing side of an inner region IA having a triangular cross-section that is a side of the wearer US in the outer packaging case 105d.

The opening OP through which the heat dissipation sheet DS passes is formed at a non-inner portion DP that is on a non-wearing side of the inner plate portion (inner portion) 71b and faces the non-inner region DA, that is, at one of the bottom plate portion 71a, the top plate portion 72a, and the outer plate portion 72b, and the other end DSb of the heat dissipation sheet DS is stuck on the peripheral side surface RS of the non-inner portion DP. In the specific example illustrated, the other end DSb of the heat dissipation sheet DS is stuck on the lower side surface 105o in particular, in consideration of heat dissipation efficiency. Note that, surfaces exposed to an outer world of the bottom plate portion 71a, the top plate portion 72a, and the outer plate portion 72b are referred to as the lower side surface 105o, the upper side surface 105n, and the outer surface 105m, respectively, but these can be referred to as a first side surface part, a second side surface part, and a third side surface part, respectively. A surface exposed to the outer world of the inner plate portion 71b is referred to as the inner surface 105i, but this can be referred to as a fourth side surface part. The following is added for confirming that, a first inner surface IS1 of the bottom plate portion 71a is on a back side of the first side surface part and faces the lens barrel 38, a second inner surface IS2 of the top plate portion 72a is on a back side of the second side surface part and faces the electronic circuit board 42, a third inner surface IS3 of the outer plate portion 72b is on a back side of the third side surface part and faces the electronic circuit board 41, and a fourth inner surface IS4 of the inner plate portion 71b is on a back side of the fourth side surface part and faces the lens barrel 38.

Since the electronic circuit boards 41 and 42 are disposed in the non-inner region DA, and the heat dissipation sheet DS dissipates heat outward the non-inside portion DP, it is possible to suppress occurrence of a relative increase in temperature in the inner plate portion 71b on an inside, which is a wearer side, of the outer packaging case 105d. In particular, the electronic circuit board 41 having a relatively high calorific value is disposed on an outside or the −X' side of a lateral intermediate line CL as a whole, and is suppressed from affecting the temperature increase in the inner plate portion 71b of the first member 71, while ensuring heat dissipation by the outer plate portion 72b of the second member 72, and the like. Note that, the electronic circuit boards 41 and 42 are not limited to the illustrated arrangement, and can be disposed at various locations in accordance with specification of the first virtual image forming optical unit 101a within the non-inner region DA. Posture of each of the electronic circuit boards 41 and 42 is not limited to extension in a horizontal direction or a vertical direction within the outer packaging case 105d, but can be inclination. However, the electronic circuit boards 41 and 42 as heat sources are desirably distanced as far as possible from each other, and disposed closer to different side surface portions, respectively.

Note that, description of heat dissipation in the second image forming body unit 105b is omitted, but in FIG. 13, the second outer packaging case 105d of the second image forming body unit 105b is obtained by inverting the arrangement of the first outer packaging case 105d and the contained components in a left and right direction. However, the electronic circuit board 41 is removed from an inside of the second outer packaging case 105d. In the case of the second image forming body unit 105b, since there is no electronic circuit board 41, for example, the opening OP can be provided in the outer plate portion 72b, and the heat dissipation sheet DS can be pulled out outward.

Figure 14:
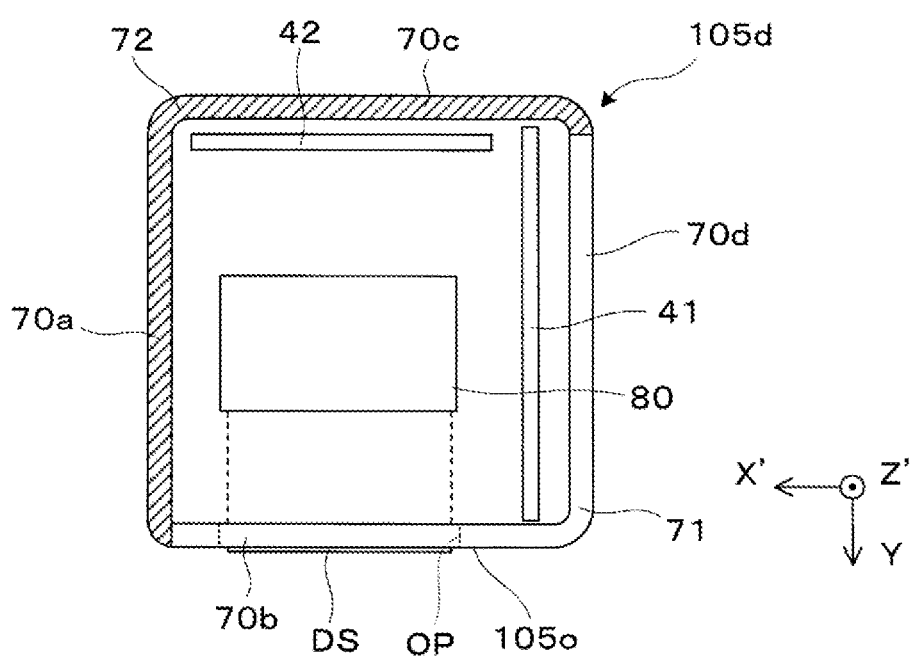
FIG. 14 is a cross-sectional view illustrating a modified example of a shape of the outer packaging case.

FIG. 14 is a diagram illustrating a modified example of the outer packaging case 105d illustrated in FIG. 13. In this case, the first member 71, which is the lower member, is constituted by the bottom plate portion 70b and the outer plate portion 70d, and the second member 72, which is the upper member, is constituted by the inner plate portion 70a and the top plate portion 70c. The electronic circuit board 41, which is the second circuit board having a relatively high calorific value, is disposed so as to be adjacent to the outer plate portion 70d, and the electronic circuit board 42, which is the first circuit board having a relatively low calorific value, is disposed so as to be adjacent to the top plate portion 70c. The heat dissipation sheet DS extending from the display element 80 is pulled out so as to extend outward via the opening OP provided in the bottom plate portion 70b, and is stuck on the lower side surface 105o, which is the first side surface part, at a leading end. In this case, the electronic circuit board 42 can be disposed so as to be adjacent to the bottom plate portion 70b, and the opening OP through which the heat dissipation sheet DS is passed can be provided in the top plate portion 70c.

Figure 15:
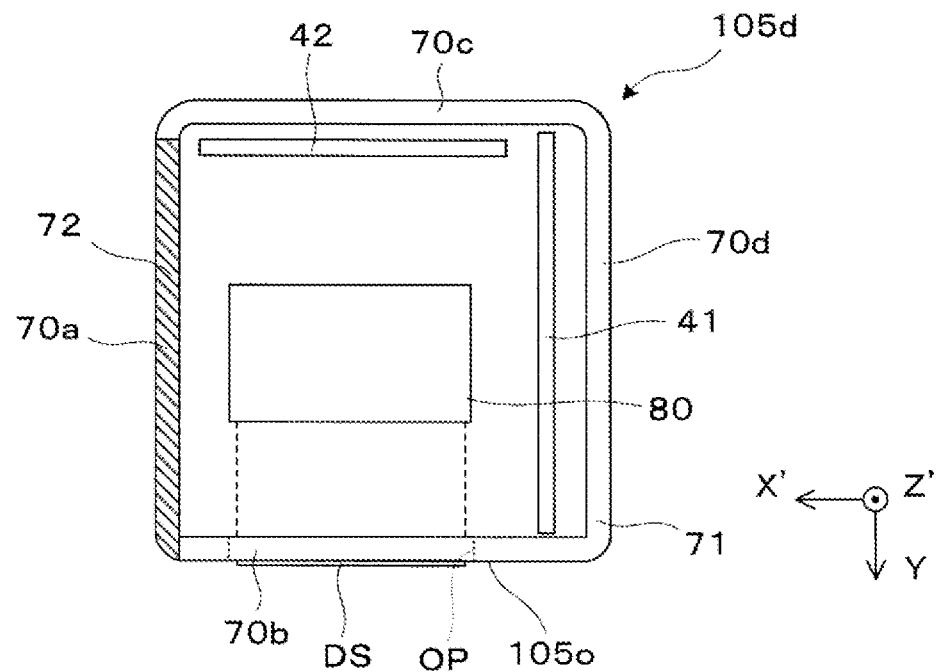
FIG. 15 is a cross-sectional view illustrating a modified example of the shape of the outer packaging case.

FIG. 15 is a diagram illustrating another modified example of the outer packaging case 105d illustrated in FIG. 13. In this case, the first member 71, which is an outer member, is constituted by the bottom plate portion 70b and the outer plate portion 70d and the top plate portion 70c, and the second member 72, which is an inner member, is constituted by the inner plate portion 70a. The electronic circuit board 41, which is the second circuit board having a relatively high calorific value, is disposed so as to be adjacent to the outer plate portion 70d, and the electronic circuit board 42, which is the first circuit board having a relatively low calorific value, is disposed so as to be adjacent to the top plate portion 70c. The heat dissipation sheet DS extending from the display element 80 is pulled out outward via the opening OP provided in the bottom plate portion 70b, and is stuck on the lower side surface 105o at a leading end. In this case, the electronic circuit board 42 can be disposed so as to be adjacent to the bottom plate portion 70b, and the opening OP through which the heat dissipation sheet DS is passed can be provided in the top plate portion 70c.

Figure 16:
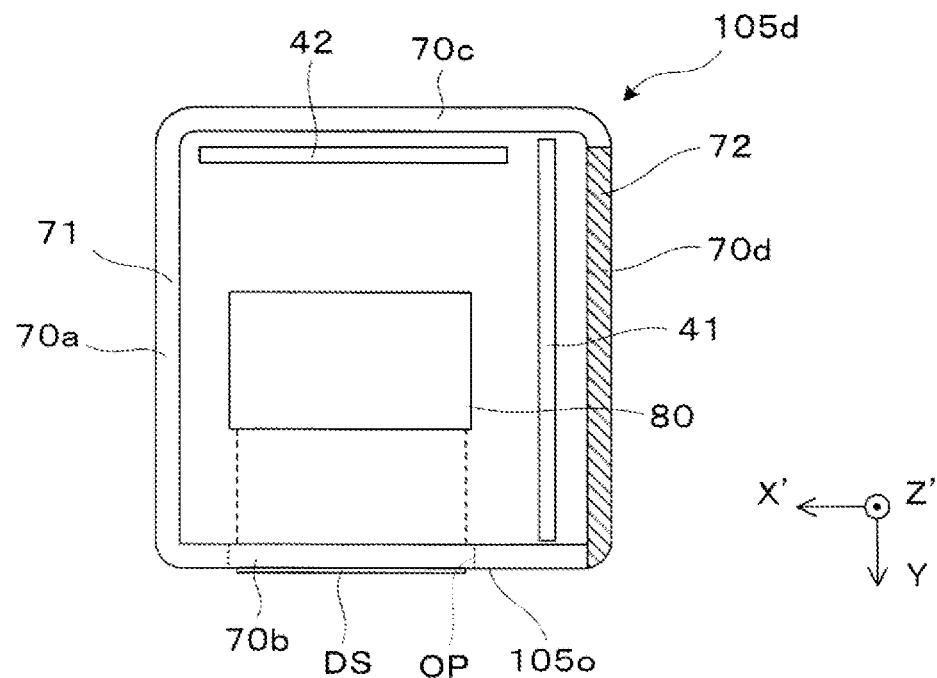
FIG. 16 is a cross-sectional view illustrating a modified example of the shape of the outer packaging case.

FIG. 16 is a diagram illustrating another modified example of the outer packaging case 105d illustrated in FIG. 13. In this case, the first member 71, which is an inner member, is constituted by the inner plate portion 70a and the bottom plate portion 70b and the top plate portion 70c, and the second member 72, which is an outer member, is constituted by the outer plate portion 70d. The electronic circuit board 41, which is the second circuit board having a relatively high calorific value, is disposed so as to be adjacent to the outer plate portion 70d, and the electronic circuit board 42, which is the first circuit board having a relatively low calorific value, is disposed so as to be adjacent to the top plate portion 70c. The heat dissipation sheet DS extending from the display element 80 is pulled out so as to extend outward via the opening OP provided in the bottom plate portion 70b, and is stuck on the lower side surface 105o at a leading end. In this case, the electronic circuit board 42 can be disposed so as to be adjacent to the bottom plate portion 70b, and the opening OP through which the heat dissipation sheet DS is passed can be provided in the top plate portion 70c.

Figure 17:
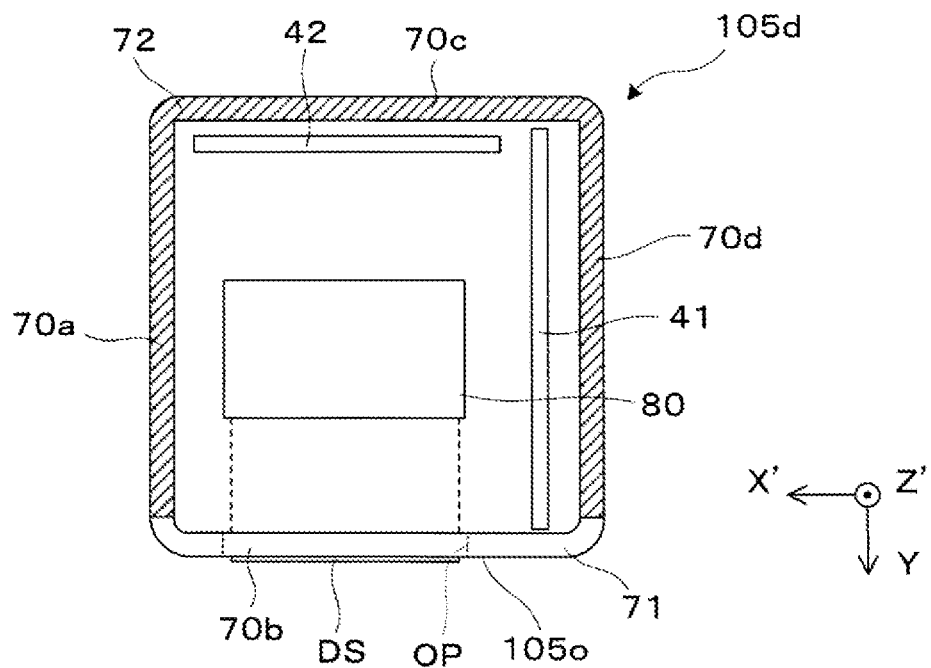
FIG. 17 is a cross-sectional view illustrating a modified example of the shape of the outer packaging case.

FIG. 17 is a diagram illustrating another modified example of the outer packaging case 105d illustrated in FIG. 13. In this case, the first member 71, which is the lower member, is constituted by the bottom plate portion 70b, and the second member 72, which is the upper member, is constituted by the inner plate portion 70a, the top plate portion 70c, and the outer plate portion 70d. The electronic circuit board 41, which is the second circuit board having a relatively high calorific value, is disposed so as to be adjacent to the outer plate portion 70d, and the electronic circuit board 42, which is the first circuit board having a relatively low calorific value, is disposed so as to be adjacent to the top plate portion 70c. The heat dissipation sheet DS extending from the display element 80 is pulled out outward via the opening OP provided in the bottom plate portion 70b, and is stuck on the lower side surface 105o at a leading end. In this case, the electronic circuit board 42 can be disposed so as to be adjacent to the bottom plate portion 70b, and the opening OP through which the heat dissipation sheet DS is passed can be provided in the top plate portion 70c.

Figure 18:
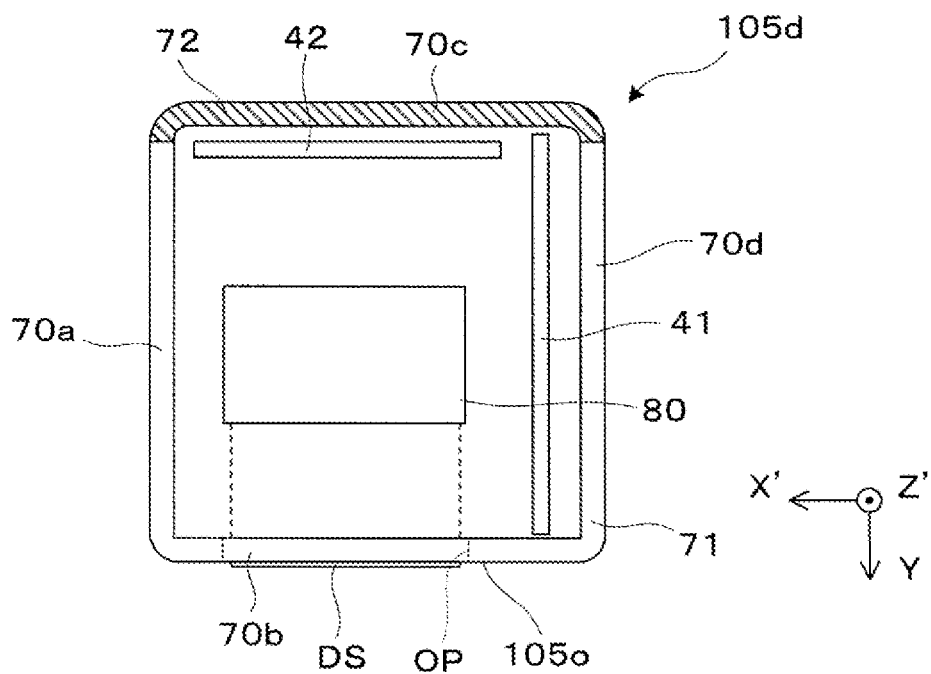
FIG. 18 is a cross-sectional view illustrating a modified example of the shape of the outer packaging case.

FIG. 18 is a diagram illustrating another modified example of the outer packaging case 105d illustrated in FIG. 13. In this case, the first member 71, which is the lower member, is constituted by the inner plate portion 70a and the bottom plate portion 70b and the outer plate portion 70d, and the second member 72, which is the upper member, is constituted by the top plate portion 70c. The electronic circuit board 41, which is the second circuit board having a relatively high calorific value, is disposed so as to be adjacent to the outer plate portion 70d, and the electronic circuit board 42, which is the first circuit board having a relatively low calorific value, is disposed so as to be adjacent to the top plate portion 70c. The heat dissipation sheet DS extending from the display element 80 is pulled out outward via the opening OP provided in the bottom plate portion 70b, and is stuck on the lower side surface 105o at a leading end. In this case, the electronic circuit board 42 can be disposed so as to be adjacent to the bottom plate portion 70b, and the opening OP through which the heat dissipation sheet DS is passed can be provided in the top plate portion 70c.

Figure 19:
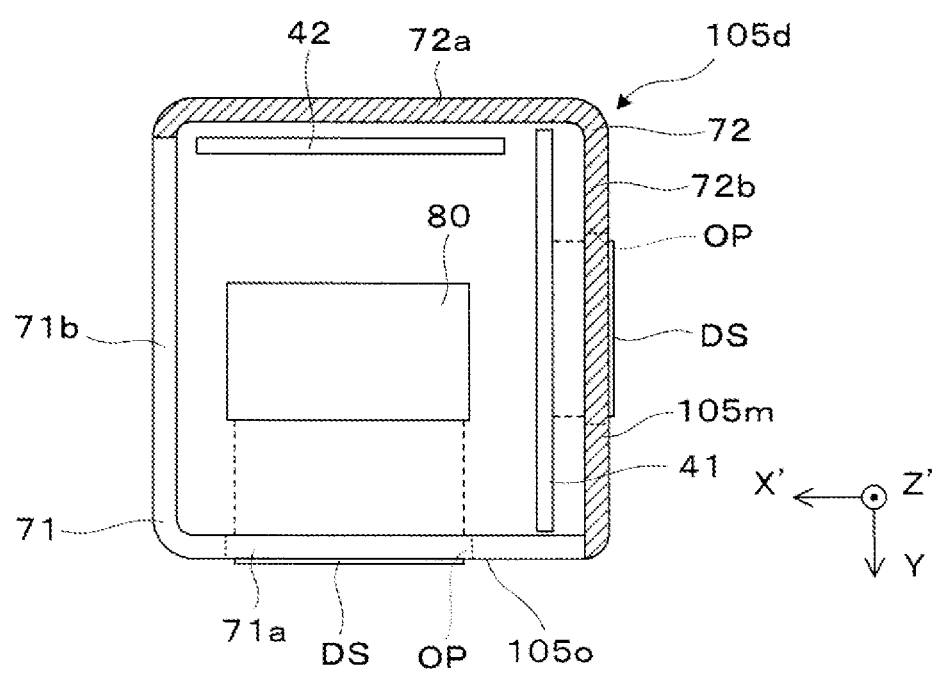
FIG. 19 is a cross-sectional view illustrating a modified example of the shape of the outer packaging case.

FIG. 19 is a diagram illustrating another modified example of the outer packaging case 105d illustrated in FIG. 13. In this case, the opening OP is also provided in the outer plate portion 72b of the second member 72, and heat generated in the electronic circuit board 41, which is the second circuit board, is discharged by the heat dissipation sheet DS to the third side surface part of the outer plate portion 72b, that is, the outer surface 105m. Note that, the electronic circuit board 41 can be disposed so as to be adjacent to the bottom plate portion 71a, to discharge heat generated in the electronic circuit board 41 to the lower side surface 105o of the bottom plate portion 71a by the heat dissipation sheet DS. In this case, heat generated in the display element 80 is discharged, for example, to the outer surface 105m of the outer plate portion 72b by the heat dissipation sheet DS.

Figure 20:
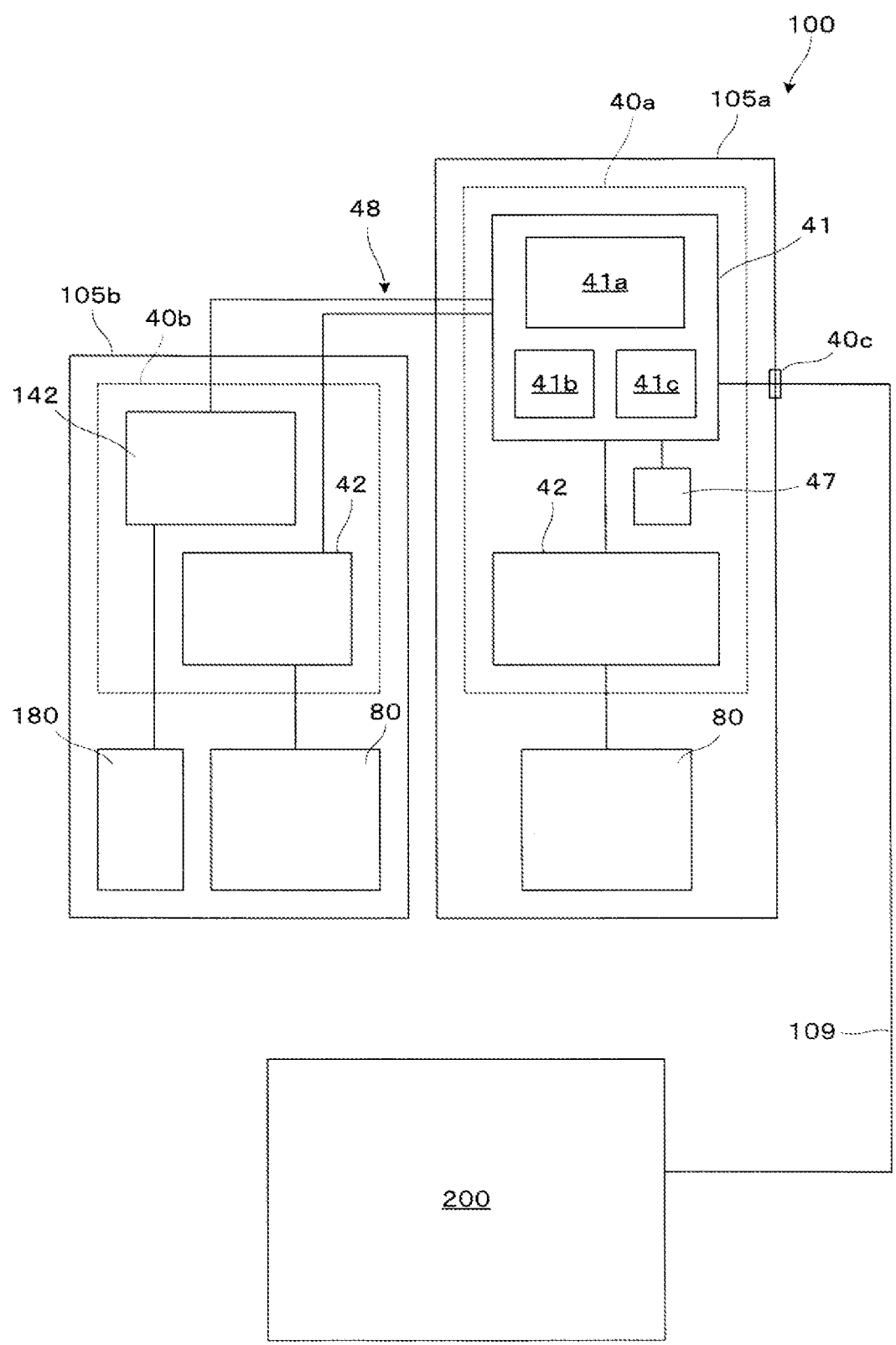
FIG. 20 is a block diagram illustrating a modified example in terms of circuit of the wearable display device.

FIG. 20 is a block diagram illustrating a modified example in terms of circuit of the wearable display device 100. In the second image forming body unit 105b for the right eye, the second circuit 40b includes an additional electronic circuit board 142, which operates under control of the electronic circuit board 41 provided on the first image forming body unit 105a, as a driving circuit board that drives a camera 180 contained in the second image forming body unit 105b. In this case, the additional electronic circuit board 142, that is, a camera signal processing board has a larger calorific value than that of the electronic circuit board 42, which is the driving circuit board of the display element 80 (specifically, for example, a calorific value of approximately 1 W or larger), and similar to the electronic circuit board 41 of the first image forming body unit 105a, it is desirable to dispose the electronic circuit board 142 so as to be adjacent to the outer surface 105m of the outer plate portion 72b that forms the outer packaging case 105d.

Figure 4:
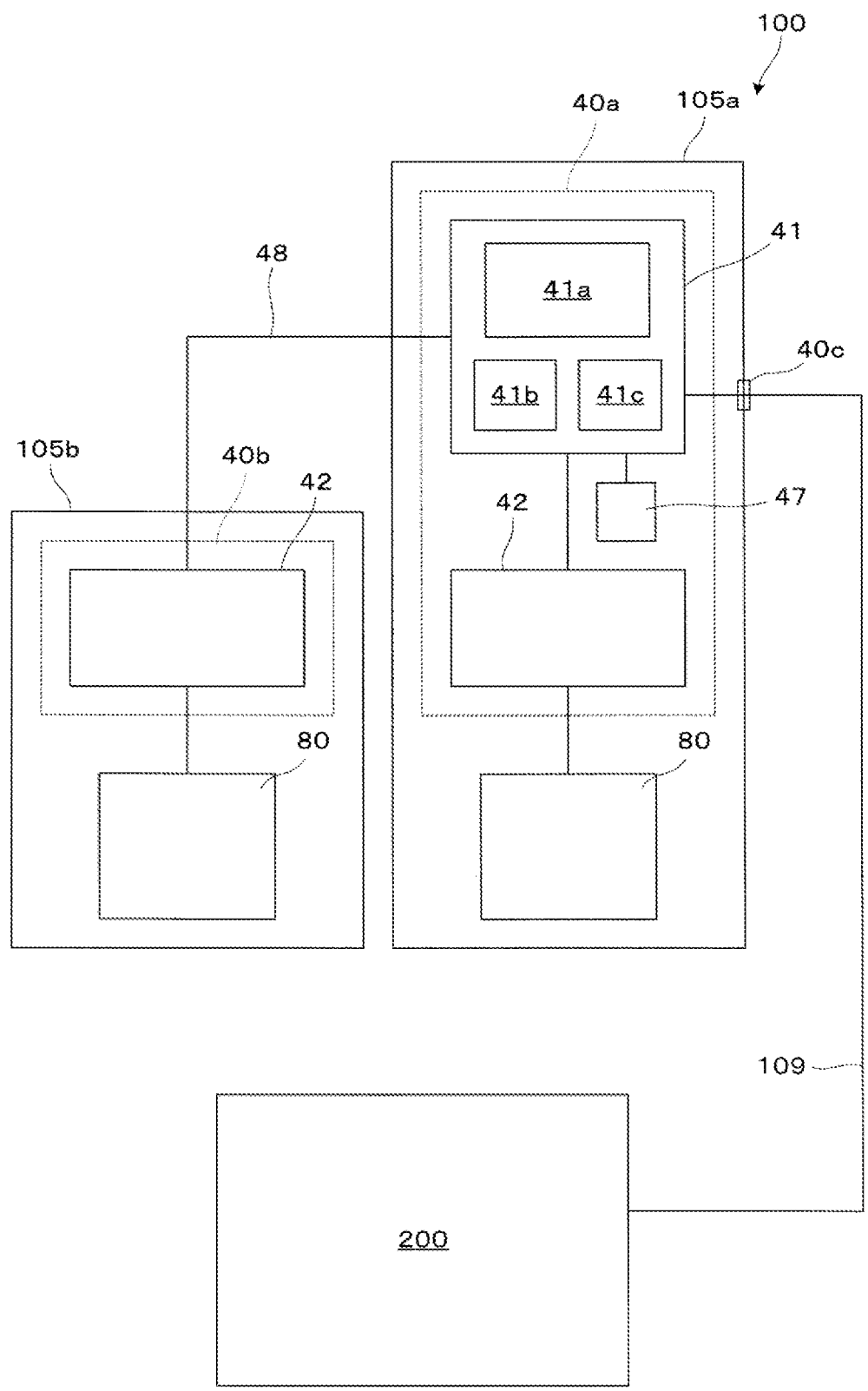
FIG. 4 is a conceptual block diagram illustrating a circuit configuration of the wearable display device.

The electronic circuit board 41 in FIG. 4, the electronic circuit board 42 in FIG. 4, or the electronic circuit board 142 in FIG. 20 is constituted by semiconductor elements such as computing elements, conversion elements, and the like. Specifically, the electronic circuit board 41 can be constituted by including any one or more of circuits such as a Digital Signal Processor (DSP), an Application Specific Integrated Circuit (ASIC), a Programmable Logic Device (PLD), a Field Programmable Gate Array (FPGA), a Graphics Processing Unit (GPU), a Central Processing Unit (CPU), and the like. Similarly, the electronic circuit boards 42 and 142 can be configured by including any one or more circuits such as a DSP, an ASIC, a PLD, an FPGA, a GPU, a CPU, and the like.

In the wearable display device 100 according to the exemplary embodiment described above, the electronic circuit board (second circuit board) 41, which is a source of larger heat, is disposed on the outside, and it is possible to suppress occurrence of a relative increase in temperature on the inside, which is the wearer side of the outer packaging case 105d. In addition, in the wearable display device 100 of the exemplary embodiment, the heat dissipation sheet DS extends outward via the opening OP provided in the outer packaging case 105d, and is stuck on the lower side surface 105o, which is a side surface of the outer packaging case 105d, thus heat dissipation to an outside of the outer packaging case 105d can be facilitated, and an increase in temperature inside the outer packaging case 105d can be suppressed.

Modified Examples and Other Matters

In the description above, the display element 80 is the panel for the display panel of the organic EL or the panel for the LCD, but the display element 80 may be a light-emitting display element represented by an LED array, a laser array, a quantum dot light-emitting element, or the like. Further, the display element 80 may be a display by using a laser scanner in which a laser light source and a scanner are combined. Note that, a Liquid Crystal On Silicon (LCOS) technique may be used instead of an LCD panel.

The outer packaging case 105d can be formed not only from the magnesium alloy, but also from aluminum or an aluminum alloy.

The outer packaging case 105d need not cover an entirety of the display element 80, the electronic circuit boards 41 and 42, that are the heat generating elements, and may cover part of these heat generating elements. Furthermore, the outer packaging case may be constituted from other substrates, cooling fins, and the like.

Figure 21:
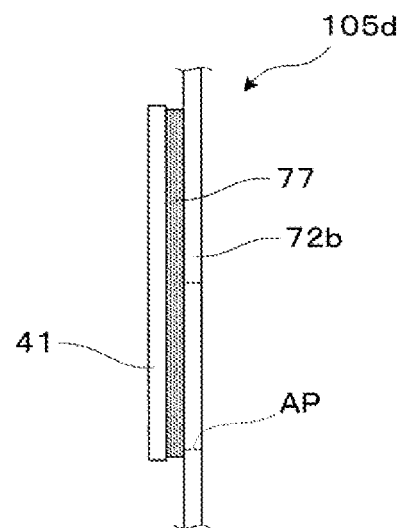
FIG. 21 is a cross-sectional view illustrating a modified example of a method for mounting an electronic circuit board.

As illustrated in FIG. 21, the electronic circuit board 41 can be disposed so as to be spaced from the outer packaging case 105d, with an additional substrate 77 such as a protective sheet or a heat dissipation sheet interposed outside the electronic circuit board 41. In this case, the electronic circuit board 41 can be divided into a plurality of circuit board portions, and the divided plurality of circuit board portions can be arranged along the outer packaging case 105d. Furthermore, similar additional substrates 77 can be further provided to laminate a plurality of the electronic circuit boards 41 in a state of being substantially parallel to the outer packaging case 105d and separated from each other. At a location where the additional substrate 77 is provided, an opening AP can also be provided in the outer packaging case 105d. Although the above description is related to the electronic circuit board 41, the electronic circuit board 42 can also be similarly disposed by using the additional substrate 77.

Figure 22:
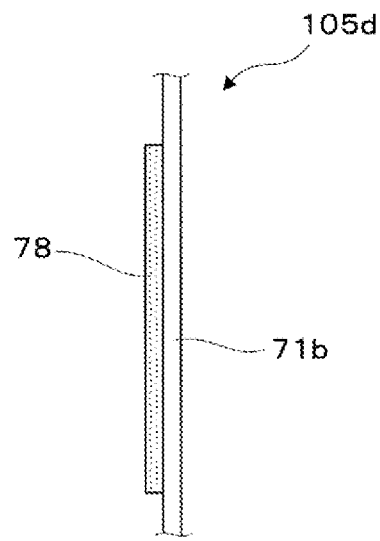
FIG. 22 is a cross-sectional view illustrating a modified example in which a heat insulating member is disposed inside the outer packaging case.

As illustrated in FIG. 22, a sheet-like heat insulating member 78 can be disposed on a surface of the inner plate portion 71b of the outer packaging case 105d. The heat insulating member 78 can be fixed to the inner plate portion 71b by using a sticking material or the like. The heat insulating member 78 is a cushion member having a heat insulating effect, and can make it difficult for the wearer US to sense an increase in temperature of the outer packaging case 105d.

The electronic circuit board 41, which is the second circuit board, can be divided into two portions. In this case as well, it is sufficient to conceive a calorific value throughout these portions, and efficient heat dissipation is achieved by disposing these portions so as to be adjacent to the outer plate portions 72*b* and 70*d*.

The electronic circuit board 41 can have various functions, without limiting to the functions described in the exemplary embodiments. Specifically, the electronic circuit board 41 can have a power related function such as, for example, a regulator of a charging circuit.

Figure 23:
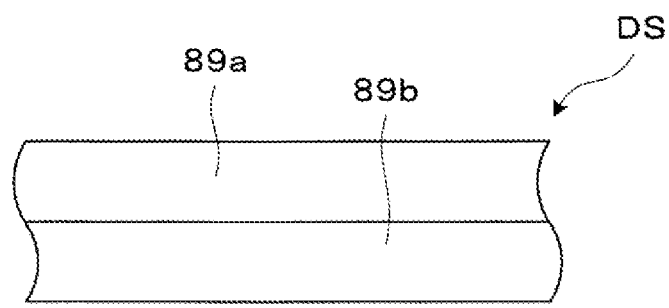
FIG. 23 is a cross-sectional view illustrating a modified example of the heat dissipation sheet.

When the heat dissipation sheet DS is a graphite sheet, the heat dissipation sheet DS can be constituted not only by a single layer, but also, as illustrated in FIG. 23, by a plurality of graphite sheets 89*a* and 89*b*. In other words, the heat dissipation sheet DS is formed by laminating the plurality of graphite sheets. In this case, it becomes easier to increase a heat transfer cross section by the heat dissipation sheet DS, and it becomes easier to increase cooling efficiency of the display element 80 by reducing thermal resistance. Note that, in the illustrated example, the two layers are used, but three or more layers may be used. The heat dissipation sheet DS can be formed from a heat conductive synthetic resin material represented by a heat conductive acrylic sheet, a silicon heat conducting sheet, or the like, without limiting to the graphite sheet, and can be formed from a metal based material or a composite thereof. A method for fixing the heat dissipation sheet DS is not limited to fixing a graphite sheet or the like with an adhesive or a sticking material, and a configuration is possible in which a graphite sheet and the like are brought into contact with the peripheral side surface RS of the outer packaging case 105*d*, and fixed by screw clamp or by pressing with a pressing member from above.

While the wearable display 100 has been described above as a binocular head-mounted display (HMD), the wearable display device 100 may be a wearable display device for a single eye. In this case, the wearable display device 100 is fixed to a spectacle frame or a dedicated frame, for example, and includes a portion corresponding to the display device 100A and a portion that fixes the portion corresponding to the display device 100A to the spectacle frame or the like. Here, in the display device 100A, the first virtual image forming optical unit 101*a* is not limited to cover a front of the eye, and may be arranged in a direction of one corner of a line-of-sight. Furthermore, the wearable display device 100 may be a device that does not allow viewing of an external world image in a see-through manner, and may be an optical system that blocks an external world image and allows observation only of a virtual image.

The wearable display device of the present disclosure is not limited to a device worn on a periphery of the eyes, and may be a wristband type display device, a finger ring type display device, or the like.

Figure 24:
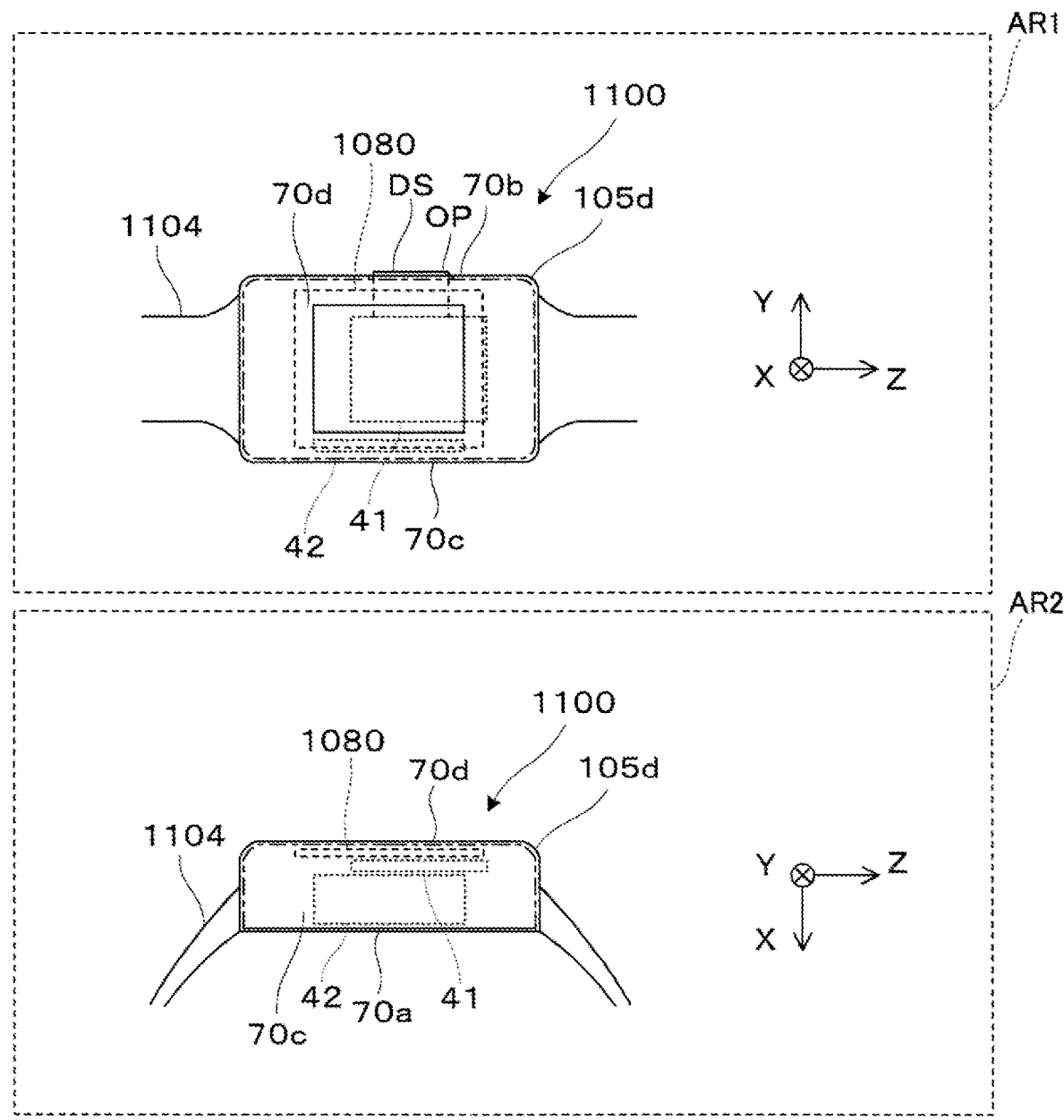
FIG. 24 is a diagram illustrating a wristband type wearable display device.

FIG. 24 is a diagram conceptually illustrating a case in which a wearable display device is a wristband type. In FIG. 24, the +X direction corresponds to an inward direction in which an arm of the observer wearing a wearable display device 1100 is present, the +Y direction corresponds to a direction in which the arm of the observer extends that is a downward direction of a tip side, and the +Z direction corresponds to a direction orthogonal to the direction in which the arm of the observer extends. In FIG. 24, the first region AR1 is a front view of the wearable display device 1100, and the second region AR2 is a side view of the wearable display device 1100. The wearable display device 1100 includes a display element 1080, the electronic circuit boards 41 and 42 in the outer packaging case 105*d*. Here, the electronic circuit board 41, which is the second circuit board having a relatively high calorific value, is disposed at a position close to the outer plate portion 70*d* on an outside, and the electronic circuit board 42, which is the first circuit board having a relatively low calorific value, is disposed at a position close to the top plate portion 70*c*. The heat dissipation sheet DS extending from the display element 1080 is pulled out outward via the opening OP provided in the bottom plate portion 70*b*, and is stuck on a surface of the bottom plate portion 70*b* at a leading end. Note that, a finger ring type display device differs in size, but is to have similar structure to the wristband type display device illustrated in FIG. 24.

A wearable display device according to a first aspect includes a display element, a first circuit board, a second circuit board, and an outer packaging case configured to house the display element, the first circuit board, and the second circuit board, wherein the second circuit board has a larger calorific value than the first circuit board, and is disposed at a further outer side, which is an opposite side to a wearer, than the first circuit board in the outer packaging case.

In the above-described wearable display device, the second circuit board, which is a source of large heat, is disposed on the outside, thus it is possible to suppress occurrence of an increase in temperature on an inside, which is a wearer side of the outer packaging case.

In a specific aspect, a second circuit board is disposed at a further outer side than an outer end of a first circuit board. In this case, the second circuit board is disposed on a farther outside, thus it is possible to further suppress an increase in temperature in an inside, which is a wearer side of an outer packaging case.

In another aspect, a second circuit board is disposed at a lower side than a first circuit board in an outer packaging case. By disposing the second circuit board, which is a source of larger heat, on the lower side, heat diffusion efficiency in the outer packaging case can be increased, and heat from the outer packaging case can be efficiently dissipated.

In yet another aspect, an outer packaging case includes a plurality of side surface portions, and a first circuit board and a second circuit board are disposed adjacent to the different side surface portions, respectively. In this case, heat dissipation from the first circuit board to the side surface portion and heat dissipation from the second circuit board to the side surface portion become efficient, and efficient cooling of the circuit boards is enabled.

In yet another aspect, a first circuit board is a driving circuit board that drives a display element, and a second circuit board is a signal processing board that processes a signal including information from outside. In this case, it can be said that the signal processing board is prone to generate heat due to a load of signal processing.

In yet another aspect, a circuit board holder for holding a first circuit board and a second circuit board in an outer packaging case is further provided. In this way, by using the circuit board holder, it is possible to freely set an arrangement of the circuit boards in the outer packaging case.

A wearable display device according to a second aspect includes a display element, a driving circuit board configured to drive the display element, a signal processing board configured to process a signal including information from outside, and an outer packaging case configured to house the display element, the driving circuit board, and the signal processing board, wherein the driving circuit board and the signal processing board are disposed in a non-inner region, which is positioned further toward a non-wearing side than an inner side, which is a wearer side, in the outer packaging case.

In the wearable display device described above, the driving circuit board and the signal processing board are disposed in the non-inner region, and it is possible to suppress occurrence of an increase in temperature in the inside, which is the wearer side of the outer packaging case.

In a specific aspect, a signal processing board is a main substrate controlling operation of a driving circuit board and having an interface function of communicating with an external device and performing signal conversion on a signal received from the external device.

In another aspect, a signal processing board is disposed at a further outer side, which is at an opposite side to a wearer than a driving circuit board, in an outer packaging case. For example, when the signal processing board is a source of larger heat, by disposing the signal processing board on the outside, it is possible to suppress occurrence of a relative increase in temperature on an inside, which is a wearer side of the outer packaging case.

In yet another aspect, a signal processing board is disposed at a lower side than a driving circuit board in an outer packaging case. In this case, diffusion efficiency of heat caused by the signal processing board in the outer packaging case can be increased, and heat dissipation effect by the outer packaging case can be increased.

In yet another aspect, an outer packaging case includes a plurality of side surface portions, and a driving circuit board and a signal processing board are disposed adjacent to the different side surface portions, respectively. In this case, heat dissipation from the driving circuit board and the signal processing board to the side surface portions becomes efficient, and efficient cooling of the driving circuit board and the signal processing board is enabled.

In yet another aspect, an outer packaging case is formed from a magnesium alloy or an aluminum alloy. Since formed from the magnesium alloy, the outer packaging case can achieve high heat conductivity while being lightweight, and heat dissipation of the circuit board and the display element via the outer packaging case can be made effective.

In yet another aspect, a heat dissipation sheet configured to conduct heat from a display element to an outer packaging case is further included, and the heat dissipation sheet extends outward through an opening provided in the outer packaging case, the heat dissipation sheet being stuck at a side surface of the outer packaging case. In this case, the heat dissipation sheet extends outward through the opening provided in the outer packaging case and is stuck on the side surface of the outer packaging case, thus heat dissipation to an outside of the outer packaging case can be facilitated, and an increase in temperature in the outer packaging case can be suppressed.

In yet another aspect, an outer packaging case holds a display element, and a lens barrel that holds an optical element for image formation. In this case, a circuit board, the lens barrel, or the like can be collectively housed in the outer packaging case, and it is possible to make a wearable display device multi-functional, while allowing an appearance thereof to be small and stylish.

In another aspect, an outer packaging case has a peripheral side surface formed by combining a first member having two side surface portions that are coupled to mutually form an angle, and a second member having two side surface portions that are coupled to mutually form an angle. In his case, the outer packaging case has a box shape that surrounds a display element, an electronic circuit board, a lens barrel, and the like from upper, lower, inner, and outer sides.

In another aspect, a heat insulating member disposed on a surface of a side surface portion at a wearer side of an outer packaging case is further included.

What is claimed is:

1. A wearable display device, comprising:
    a display element that emits an imaging light;
    a light-guiding member that guides the imaging light;
    an optical element that is disposed between the display element and the light-guiding member and that emits the imaging light from the display element to the light-guiding member;
    a first circuit board that drives the display element;
    a second circuit board that has a larger calorific value than the first circuit board; and
    an outer packaging case that houses the display element, the optical element, the first circuit board, and the second circuit board, wherein
    the second circuit board is disposed at a further outer side, which is an opposite side to a wearer when viewed from a first direction in which both eyes of the wearer are aligned, than the first circuit board in the outer packaging case,
    the second circuit board is housed by the outer packaging case so as to overlap with the optical element when viewed from the first direction, and
    the first circuit board is housed by the outer packaging case so as to overlap with the optical element when viewed from a second direction intersecting and perpendicular to the first direction.

2. The wearable display device according to claim 1, wherein the second circuit board is disposed at a further outer side than an outer end of the first circuit board.

3. The wearable display device according to claim 1, wherein the second circuit board is disposed at a lower side than the first circuit board in the outer packaging case.

4. The wearable display device according to claim 1, wherein the outer packaging case includes a plurality of side surface portions, and the first circuit board and the second circuit board are disposed adjacent to different ones of the side surface portions, respectively.

5. The wearable display device according to claim 1, wherein the second circuit board is a signal processing board that processes a signal including information from outside.

6. The wearable display device according to claim 1, further comprising a circuit board holder configured to hold the first circuit board and the second circuit board in the outer packaging case.

7. The wearable display device according to claim 1, wherein the outer packaging case is formed from a magnesium alloy or an aluminum alloy.

8. The wearable display device according to claim 1, further comprising a heat dissipation sheet configured to conduct heat from the display element to the outer packaging case, wherein
    the heat dissipation sheet extends outward through an opening provided in the outer packaging case, the heat dissipation sheet being stuck at a side surface of the outer packaging case.

9. The wearable display device according to claim 1, wherein the outer packaging case holds the display element, and a lens barrel holds the optical element for image formation.

10. The wearable display device according to claim 1, wherein the outer packaging case has a peripheral side surface formed by combining a first member having two side surface portions that are coupled to mutually form an angle and a second member having two side surface portions that are coupled to mutually form an angle.

11. The wearable display device according to claim 1, further comprising a heat insulating member disposed on a surface of a side surface portion at a wearer side of the outer packaging case.

12. A wearable display device, comprising:
display element that emits an imaging light;
a light-guiding member that guides the imaging light;
an optical element that is disposed between the display element and the light-guiding member and that emits the imaging light from the display element to the light-guiding member;
a driving circuit board configured to drive the display element;
a signal processing board that is configured to process a signal including information from outside and that has a larger calorific value than the first circuit board; and
an outer packaging case that houses the display element, the optical element, the driving circuit board, and the signal processing board, wherein
the driving circuit board and the signal processing board are disposed in a non-inner region, which is positioned when viewed from a first direction in which both eyes of a wearer are aligned further toward a non-wearing side than an inner side, which is a wearer side, in the outer packaging case,
the signal processing board is housed by the outer packaging case so as to overlap with the optical element when viewed from the first direction, and
the driving circuit board is housed by the outer packaging case so as to overlap with the optical element when viewed from a second direction intersecting and perpendicular to the first direction.

13. The wearable display device according to claim 12, wherein the signal processing board is a main substrate controlling operation of the driving circuit board and having an interface function of communicating with an external device and performing signal conversion on a signal received from the external device.

14. The wearable display device according to claim 12, wherein the signal processing board is disposed at a further outer side, which is at an opposite side to the wearer when viewed from the first direction, than the driving circuit board in the outer packaging case.

15. The wearable display device according to claim 12, wherein the signal processing board is disposed at a lower side than the driving circuit board in the outer packaging case.

16. The wearable display device according to claim 12, wherein the outer packaging case includes a plurality of side surface portions, and the driving circuit board and the signal processing board are disposed adjacent to different ones of the side surface portions, respectively.

\* \* \* \* \*